United States Patent
Allen et al.

(10) Patent No.: US 7,678,537 B2
(45) Date of Patent: Mar. 16, 2010

(54) GRADED TOPCOAT MATERIALS FOR IMMERSION LITHOGRAPHY

(75) Inventors: Robert D. Allen, San Jose, CA (US); Phillip Brock, Sunnyvale, CA (US); Daniel P. Sanders, San Jose, CA (US); Linda K. Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/058,893

(22) Filed: Mar. 31, 2008

(65) Prior Publication Data

US 2008/0311506 A1 Dec. 18, 2008

Related U.S. Application Data

(63) Continuation of application No. 11/763,705, filed on Jun. 15, 2007.

(51) Int. Cl.
 G03F 7/207 (2006.01)
 G03F 7/26 (2006.01)
 G03F 7/38 (2006.01)

(52) U.S. Cl. ............ 430/327; 430/325; 430/273.1; 430/326; 430/330; 430/311; 438/952

(58) Field of Classification Search ............... None
See application file for complete search history.

(56) References Cited

U.S. PATENT DOCUMENTS

| | | | |
|---|---|---|---|
| 7,205,093 B2 * | 4/2007 | Hinsberg, III | 430/273.1 |
| 2005/0202340 A1 * | 9/2005 | Houlihan et al. | 430/270.1 |
| 2005/0202347 A1 * | 9/2005 | Houlihan et al. | 430/311 |
| 2005/0233254 A1 | 10/2005 | Hatakeyama et al. | |
| 2006/0105272 A1 | 5/2006 | Gallagher et al. | |
| 2006/0110945 A1 | 5/2006 | Ho et al. | |
| 2006/0111550 A1 | 5/2006 | Hata et al. | |
| 2006/0127803 A1 | 6/2006 | Jung et al. | |
| 2006/0188804 A1 | 8/2006 | Allen et al. | |
| 2006/0275706 A1 * | 12/2006 | Corliss et al. | 430/311 |
| 2007/0212646 A1 | 9/2007 | Gallagher et al. | |
| 2007/0254235 A1 * | 11/2007 | Allen et al. | 430/270.1 |
| 2008/0032228 A1 | 2/2008 | Khojasteh et al. | |
| 2008/0286682 A1 * | 11/2008 | Yeh et al. | 430/270.1 |

FOREIGN PATENT DOCUMENTS

| WO | WO 2005/064409 A2 * | 7/2005 |
| WO | WO2008021291 A2 | 2/2008 |

OTHER PUBLICATIONS

Notice of Allowance for U.S. Appl. No. 11/763,705, filed Jun. 15, 2007; Confirmation No. 4144.

* cited by examiner

*Primary Examiner*—Cynthia Hamilton
(74) *Attorney, Agent, or Firm*—Schmeiser, Olsen & Watts

(57) ABSTRACT

A topcoat material for immersion lithography and a method of performing immersion lithography using the topcoat material. The topcoat material includes a mixture of a first polymer and a second polymer. The first and second polymers of the topcoat material, when the topcoat material is formed into a topcoat layer between an immersion fluid and a photoresist layer, disperse non-homogenously throughout the topcoat layer.

19 Claims, 5 Drawing Sheets

GRADED TOPCOAT MATERIALS FOR IMMERSION LITHOGRAPHY

This application is a continuation of U.S. patent application Ser. No. 11/763,705 filed on Jun. 15, 2007.

FIELD OF THE INVENTION

The present invention relates to the field of immersion photolithography; more specifically, it relates to topcoat compositions for immersion lithography.

BACKGROUND OF THE INVENTION

In immersion lithography, an immersion fluid having a refractive index higher than air is placed between the final lens element or window of the exposure system and the photoresist layer to be exposed. This affords higher numerical aperture imaging systems and increases the depth of focus so smaller features may be imaged with good process latitude. Immersion fluids can have adverse effects on the photoresist by extracting key components the photoresist such as sensitizers and photoacid generators and can have adverse effects on the exposure system such as clouding the immersed lens by depositing extracted photoresist materials on the lens. To overcome these problems, topcoats are used to coat the photoresist and protect the photoresist from the immersion fluid. Topcoat materials are further designed to exhibit high receding contact angles with the immersion fluid (usually water), in order to enable rapid scanning of the wafer without film pulling (i.e., leaving a trail of film or droplets behind the receding meniscus of the immersion fluid). Since these residual fluid droplets cause defects in the final lithographically printed features, the receding contact angle of the immersion fluid with the topcoat effectively determines maximum wafer scan rate and tool throughput. However, current topcoat materials interact with both the immersion fluid at the topcoat/immersion fluid interface and with the photoresist at the topcoat/photoresist interface. The requirement to optimize the topcoat interaction at both interfaces has limited the performance of topcoat materials, particularly in terms of increasing the receding contact angle (and thereby increasing maximum wafer scan rates). Accordingly, there exists a need in the art to overcome the deficiencies and limitations described hereinabove.

SUMMARY OF THE INVENTION

A first aspect of the present invention is a composition of matter, comprising: a mixture of a first polymer and a second polymer, the first polymer containing fluorine, the second polymer miscible with the first polymer, the second polymer different from the first polymer, a weight percentage of fluorine in the first polymer greater than a weight percentage of fluorine in the second polymer; a casting solvent; the first polymer comprising one or more different monomers selected from the group consisting of:

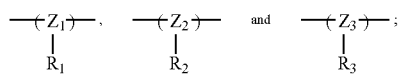

wherein each $Z_1$, $Z_2$, and $Z_3$ is independently selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, carbonate groups, acetal groups, ketal groups, siloxyl groups, carboxylic acid groups, carboxylic acid anhydride groups, carboxylic acid anhydride half-ester groups, ether groups, amide groups, carbamate groups, thioether groups, fluorinated linear alkylenes, fluorinated branched alkylenes, fluorinated cyclic alkylenes, polycyclic alkylenes, fluorinated linear heteroalkylenes, fluorinated branched heteroalkylenes, fluorinated cyclic heteroalkylenes, fluorinated polycyclic heteroalkylenes, fluorinated ester groups, fluorinated carbonyl groups, fluorinated carbonate groups, fluorinated acetal groups, fluorinated ketal groups, fluorinated siloxyl groups, fluorinated carboxylic acid groups, fluorinated carboxylic acid anhydride groups, fluorinated carboxylic acid anhydride half-ester groups, fluorinated ether groups, fluorinated amide groups, fluorinated carbamate groups, and fluorinated thioether groups; wherein $R_1$ is selected from the group consisting of a fluoroalcohol group, a fluoroalcohol group protected with an acid-labile group, a fluoroalcohol group protected with a base-labile group, a fluoroalcohol group protected with an acid-labile fluorinated group, a fluoroalcohol group protected with a base-labile fluorinated group, and an —$X_1$—$Y_1$ group wherein $X_1$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_1$ is selected from the group consisting of a fluoroalcohol group, a fluoroalcohol group protected with an acid-labile group, a fluoroalcohol group protected with a base-labile group, a fluoroalcohol group protected with an acid-labile fluorinated group, and a fluoroalcohol group protected with a base-labile fluorinated group; wherein $R_2$ is selected from the group consisting of hydrogen, fluorine, a fluoroalcohol group, a sulfonamide group, a phenolic group, a naphtholic group, a carboxylic acid group and a sulfonic acid group and an —$X_2$—$Y_2$ group wherein $X_2$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups amide groups, ether groups, thioether groups, carbonate groups, carbamate groups, acetal groups, ketal groups and $Y_2$ is selected from the group consisting of a fluoroalcohol group, a sulfonamide group, a phenolic group, a naphtholic group, a carboxylic acid group and a sulfonic acid group; wherein $R_3$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes and an —$X_3$—$Y_3$ group wherein $X_3$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_3$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes; and the second polymer comprising one or more different monomers selected from the group consisting of:

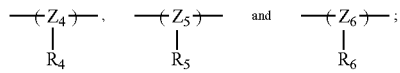

wherein each $Z_4$, $Z_5$, and $Z_6$ is independently selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, carbonate groups, acetal groups, ketal groups, siloxyl groups, carboxylic acid groups, carboxylic acid anhydride groups, carboxylic acid anhydride half-ester groups, ether groups, amide groups, carbamate groups, thioether groups, fluorinated linear alkylenes, fluorinated branched alkylenes, fluorinated cyclic alkylenes, polycyclic alkylenes, fluorinated linear heteroalkylenes, fluorinated branched heteroalkylenes, fluorinated cyclic heteroalkylenes, fluorinated polycyclic heteroalkylenes, fluorinated ester groups, fluorinated carbonyl groups, fluorinated carbonate groups, fluorinated acetal groups, fluorinated ketal groups, fluorinated siloxyl groups, fluorinated carboxylic acid groups, fluorinated carboxylic acid anhydride groups, fluorinated carboxylic acid anhydride half-ester groups, fluorinated ether groups, fluorinated amide groups, fluorinated carbamate groups, and fluorinated thioether groups; wherein $R_4$ is selected from the group consisting of a sulfonic acid group, a sulfinic acid group, a carboxylic acid group and an —$X_4$—$Y_4$ group wherein $X_4$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_4$ is selected from the group consisting of a sulfonic acid group, a sulfinic acid group, and a carboxylic acid group; wherein $R_5$ is selected from the group consisting of hydrogen, fluorine, a fluoroalcohol group, a sulfonamide group, a phenolic group, a naphtholic group, a carboxylic acid group and a sulfonic acid group and an —$X_5$—$Y_5$ group wherein $X_5$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_5$ is selected from the group consisting of a fluoroalcohol group, a sulfonamide group, a phenolic group, a naphtholic group, a carboxylic acid group and a sulfonic acid group; and wherein $R_6$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes and an —$X_6$—$Y_6$ group wherein $X_6$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_6$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes.

A second aspect of the present invention is a method of forming an image in a photoresist layer, (a) forming the photoresist layer over a substrate; (b) forming a topcoat layer on a top surface of the photoresist layer, the topcoat layer comprising a first polymer and a second polymer, the second polymer different from the first polymer, the second polymer miscible with the first polymer, the first and second polymers of the topcoat layer dispersing non-homogenously in a vertical direction perpendicular to the top surface of the photoresist layer; (c) forming a layer of immersion fluid between the topcoat layer and a final lens element or window of an immersion lithography system; (d) exposing the photoresist layer to radiation through a photomask having opaque and clear regions, the opaque regions blocking the radiation and the clear regions being transparent to the radiation, the radiation changing the chemical composition of regions of the photoresist layer exposed to the radiation, forming exposed and unexposed regions in the photoresist layer; and (e) removing either the exposed regions of the photoresist layer or the unexposed regions of the photoresist layer.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION OF THE INVENTION

Figure 1A:
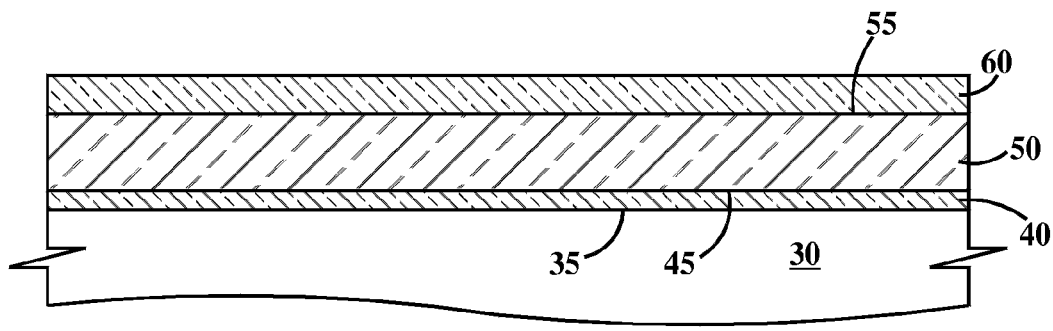
FIGS. 1A through 1C are partial cross-sectional views illustrating a semiconductor manufacturing process according to the present invention.
Figure 1B:
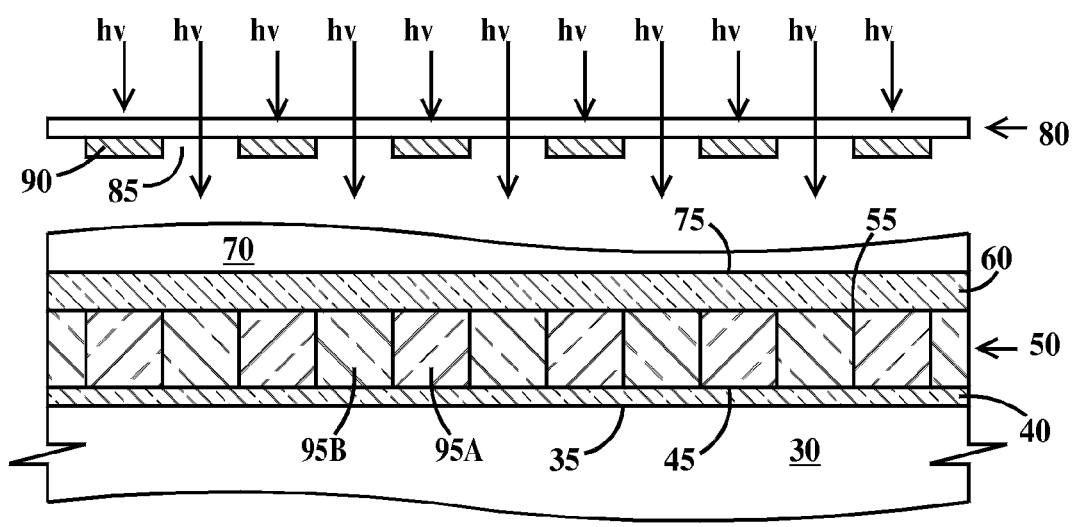
Figure 1C:
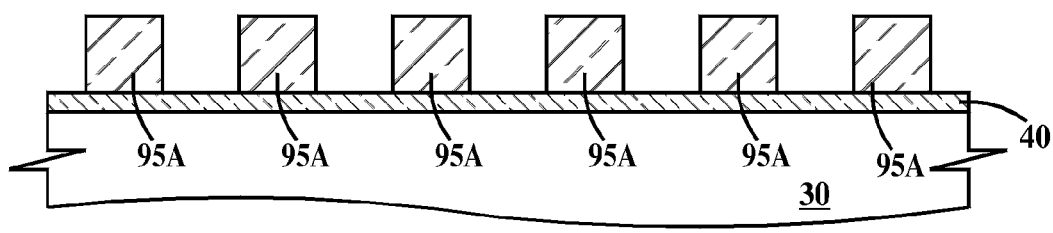

FIGS. 1A through 1C are partial cross-sectional views illustrating a semiconductor manufacturing process according to the present invention. In FIG. 1A, a substrate 30 is provided. In one example, substrate 30 is a semiconductor substrate. Examples of semiconductor substrates include but are not limited to bulk (single crystal) silicon wafers and silicon on insulator (SOI) wafers. Formed on a top surface 35 of substrate 30 is an optional antireflective coating (ARC) 40. In one example, ARC 40 is spin applied and a post ARC apply bake (heated above room temperature to remove most of the ARC solvent) is performed. If ARC 40 is used, then formed on a top surface 45 of ARC 40 is a photoresist layer 50. Photoresist layer 50 may be formed over other layers formed over substrate 30 as well or formed over substrate 30 itself. A photoresist is defined material that will either become soluble in a developer or insoluble in a developer when exposed to actinic radiation (e.g. light). In one example, the wavelength of the actinic radiation is about 250 nm or less. In one example, photoresist layer 50 is spin applied and a post photoresist apply bake, also known as a pre-exposure bake or a pre-bake (heated above room temperature to remove most of the photoresist solvent), is performed. Next a polymeric topcoat layer 60 comprising two polymers is formed on a top surface 55 of photoresist layer 50. Topcoat layer 60 is then baked (heated above room temperature to remove most of the topcoat casting solvent).

Prior to application (e.g., in liquid form from the bottle), the two polymers are homogenously mixed. However, the two polymers disperse non-homogenously during application of liquid topcoat to top surface 55 of photoresist layer so the applied topcoat layer has concentration gradients of the two polymers, one polymer being attracted to the topcoat/photoresist interface (i.e., the bottom surface of topcoat layer 60) and the other polymer being attracted to the air/topcoat interface (i.e., the top surface of topcoat layer 60). Even after baking, the polymer structure of topcoat layer 60 will remain graded.

Figure 2:
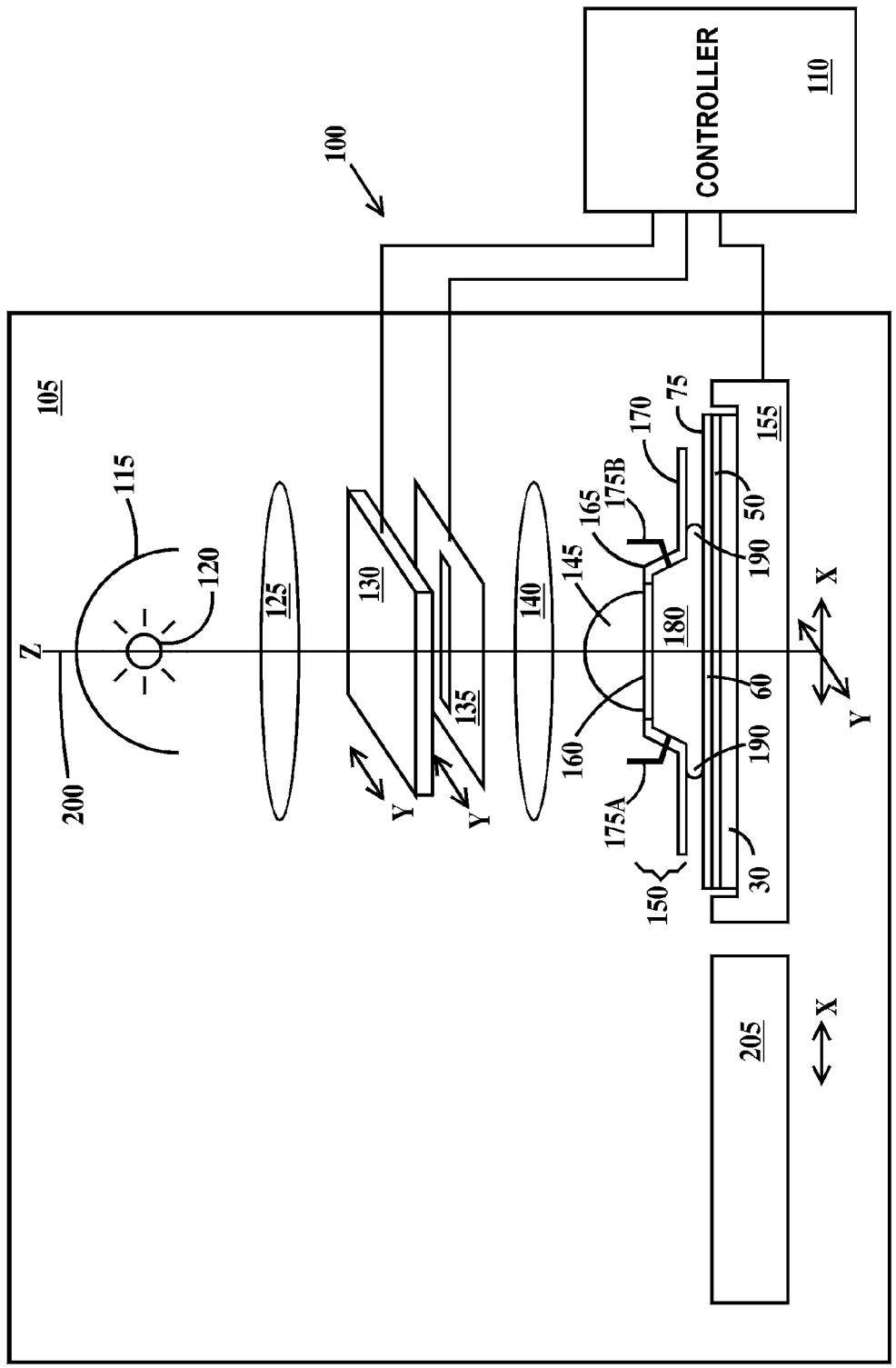
FIG. 2 is a diagram of an exemplary immersion photolithographic system that may be used to process a semiconductor wafer having a topcoat layer according to the present invention.

In FIG. 1B, a layer of immersion fluid 70 is formed over a top surface 75 of topcoat layer 60 in an immersion photolithography tool (see FIG. 2 and description infra). Examples of immersion fluids include water, water with soluble chemical additives, a hydrocarbon fluid, and water or hydrocarbon-based nano-particle dispersions. Examples of nano-particles include but are not limited to particles MgO, $Al_2O_3$, $TiO_2$, $HfO_2$ having maximum dimensions no greater than about 10 nm. Light of a wavelength to which photoresist layer 50 is sensitive is passed through a photomask 80. Photomask 80 has clear regions 85 that transmit the light and opaque regions 90 that block the light. Exposure of photoresist layer 50 to light through photomask 80 forms unexposed regions 95A of photoresist layer 50 and exposed regions 95B of photoresist layer 50. Exposed regions 95B are also known as latent image regions. An optional post exposure bake (heated above room temperature to drive the photoresist chemistry) may be performed.

Although a positive photoresist is shown in FIG. 1B, the present invention also works well with negative photoresist systems or dual tone photoresist systems. The present invention is well suited for use with chemically amplified resists. In negative photoresist systems, the photoresist will develop away where it is not exposed to light, so a photomask of polarity opposite to that illustrated in FIG. 1B is required. Dual tone resists can act either negatively or positively depending upon the developer system used.

In FIG. 1C, substrate 30 is removed from the immersion photolithography tool and photoresist layer 50 is developed to remove exposed regions 95B (see FIG. 1B) and leave behind unexposed regions 95A. In one example the developer comprises an aqueous solution of a base such as tetramethylammonium hydroxide (TMAH). Topcoat layer 60 (see FIG. 1B) is also removed by the developer. An optional post development bake (heated above room temperature to harden the photoresist images) may be performed.

FIG. 2 is a diagram of an exemplary immersion photolithographic system that may be used to process a semiconductor wafer having a topcoat layer according to the present invention. In FIG. 2 an immersion lithography system 100 includes a controlled environment chamber 105 and a controller 110. Contained within controlled environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150 and a wafer chuck 155. Immersion head 150 includes a transparent window 160, a central chamber portion 165, a surrounding plate portion 170, an immersion fluid inlet 175A and an immersion fluid outlet 175B. An immersion fluid 180 fills central chamber portion 165 and contacts a top surface 75 of topcoat layer 60 formed on a top surface of photoresist layer 50 formed top surface of substrate 30. Topcoat layer 60 comprises a mixture of two polymers as described infra. Alternatively, an optional ARC layer may be formed between substrate 30 and photoresist layer 50. In one example, immersion fluid 180 includes water. Plate portion 170 is positioned close enough to topcoat layer 60 to form a meniscus 190 under plate portion 170. Window 160 must be transparent to the wavelength of light selected to expose photoresist layer 50.

Focusing mirror 115, light source 120, first focusing lens 125, a mask 130, exposure slit 135, second focusing lens 140, final focusing lens 145 and immersion head 150 are all aligned along an optical axis 200 which also defines a Z direction. An X direction is defined as a direction orthogonal to the Z direction and in the plane of the drawing. A Y direction is defined as a direction orthogonal to both the X and Z directions. Wafer chuck 155 may be moved in the X and Y directions under the direction of controller 110 to allow formation of regions of exposed and unexposed photoresist in photoresist layer 50. As an XY-stage moves, new portions of topcoat layer 60 are brought into contact with immersion fluid 180 and previously immersed portions of the topcoat layer are removed from contact with the immersion fluid. Mask 130 and slit 135 may be moved in the Y direction under the control of controller 110 to scan the image (not shown) on mask 130 onto photoresist layer 50. In one example, the image on mask 130 is a 1× to a 10× magnification version of the image to be printed and includes one or multiple integrated circuit chip images.

When exposure is complete, substrate 30 is removed from controlled environment chamber 105 without spilling immersion fluid 180. To this end, controlled environment chamber 105 also includes a cover plate 205 that may be moved to first abut with wafer chuck 155 and then moved with the wafer chuck as the wafer chuck is moved out of position from under immersion head 150, the cover plate replacing the wafer chuck under immersion head 150.

An ideal topcoat material would exhibit the following properties: (1) high contact angle with water (particularly a high receding contact angle), (2) low or moderate contact angle with photoresist developers such as aqueous tetramethylammonium hydroxide (TMAH), (3) fast and uniform dissolution in the developer, (4) contain functional groups (such as sulfonic acid) to control photoresist profiles and reduce defects, (5) have a sufficiently high glass transition temperature to minimize inter-diffusion with the resist during various post-application and post-exposure bakes, (6) be soluble in casting solvents that do not dissolve photoresist materials, and (7) be relatively low cost (e.g., include inexpensive monomers). Because many of these requirements rely on optimizing two competing properties simultaneously, it has been very difficult to develop an ideally performing topcoat material.

The present invention is a non-homogenous (e.g., graded) topcoat system in which a highly fluorinated polymer (class A polymer) is blended with an acidic polymer (class B polymer). The non-homogenous topcoat system includes a mixture of at least one polymer of each of class A and class B, which are miscible with each other and which can be cast on top of a photoresist layer prior to immersion lithography. Instead of forming a homogeneous layer or a micro-phase separated layer morphology, the polymer mixture is designed such that the two polymers form a vertically non-homogenous layer during casting. The relative quantity of A type polymer varies in a vertical direction defined as perpendicular to a top surface of the photoresist layer and the B type polymer varies in the vertical direction. Each polymer segregates to the interface for which it was designed. The lower surface energy, more highly fluorinated class A polymer is at its maximum molar concentration in the topcoat layer at the air (later immersion fluid)/topcoat interface and at its minimum molar concentration in the topcoat layer at the topcoat/photoresist interface. The acidic class B polymer is at its minimum molar concentration in the topcoat layer at the air (later immersion fluid)/topcoat interface and at its maximum molar concentration in the topcoat layer at the topcoat/photoresist interface. In one example, the weight percentage of type A polymer is greater than the weight percentage of type B polymer at the topcoat to air/immersion fluid interface. In one example, the weight percentage of type B polymer is greater than the weight percentage of type A polymer at the topcoat to photoresist interface.

The ideal properties of the class A polymer are: (1) includes a high fluorine content for surface energy control and high water contact angles, (2) includes an acidic pendent group(s) capable of being wet and de-protonated by aqueous base developer, (3) a sufficient dissolution rate in aqueous base developer so as to be easily removable (e.g., greater than about 5 nm/sec), and (4) solubility in a solvent for casting solvent that does not dissolve photoresist (e.g., an alcoholic or ethereal solvent).

The ideal properties of the class B polymer are: (1) includes a highly acidic pendent group(s) (such as sulfonic acid) for profile control, (2) includes an acidic pendent group(s) capable of being wet and de-protonated by aqueous base developer, (3) a sufficient dissolution rate in aqueous base developer so as to be easily removable (e.g., greater than about 5 nm/sec), (4) a lower fluorine content than the class A polymer, (5) a higher affinity for photoresist than the class A polymer in order to drive vertical polymer concentration gradients rather than dispersed island formation, (6) compatibility with the photoresist layer (e.g., will not cause resist scumming, t-topping, line collapse and other defects), and (7) solubility in the same solvent as the class A solvent. Topcoat compositions according to the embodiments of the present invention advantageously require a dose of radiation to form a developable image in a photoresist layer that is about equal to a dose of radiation required to form a developable image in the photoresist layer if the photoresist layer were covered by a layer consisting only of the class B polymer.

An acidic group is defined as a group having a $pK_a$ less than that of water. The $pK_a$ of water is slightly greater than 15 (as measured in water) or 31 (as measured in dimethylsulfoxide). Preferable acidic groups have a $pK_a$ (negative log of the acid dissociation constant) less than about 13 (as measured in water) or 24 (as measured in dimethylsulfoxide). A strongly acidic group is defined as a group having a $pK_a$ of less than about 3 (as measured in water) or 8 (as measured in dimethylsulfoxide). A highly fluorinated polymer is defined as a polymer containing more than about 25 percent by weight fluorine. A polymer with low fluorine content is defined as a polymer containing less than about 15 percent by weight fluorine. A polymer with moderate fluorine content is defined as a polymer containing between than about 15 percent by weight fluorine and about 25 percent by weight fluorine. A fluoroalcohol is defined as an organic compound bearing a hydroxyl group wherein one or more non-hydroxyl group hydrogen atoms are replaced with fluorine atoms. The fluoroalcohol may be comprised of a linear, branched, cyclic, polycyclic, or aromatic structure. Many non-limiting examples of such fluoroalcohols may be found in H. Ito "Chemical Amplification Resists for Microlithography," *Adv. Polym. Sci.* 2005, 172, 37-245.

Class A polymers may be described as having the structure:

$$-(A_1-A_2-A_3\ldots A_N)- \tag{I};$$

wherein each monomer $A_1$ through $A_N$ is independently selected from the group of monomers consisting of structures II, III and IV described infra. Structure I should not be interpreted as meaning all polymers in a given sample of a class A polymer have the same number of monomer units, but rather N can vary between individual polymers. N could also be thought of as being the average number of monomer units in a given sample of class A polymers.

Class A polymers comprise one or more different monomers selected from the group consisting of:

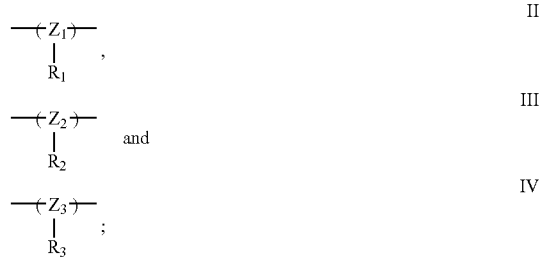

wherein each $Z_1$, $Z_2$, and $Z_3$ is independently selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, carbonate groups, acetal groups, ketal groups, siloxyl groups, carboxylic acid groups, carboxylic acid anhydride groups, carboxylic acid anhydride half-ester groups, ether groups, amide groups, carbamate groups, thioether groups, fluorinated linear alkylenes, fluorinated branched alkylenes, fluorinated cyclic alkylenes, polycyclic alkylenes, fluorinated linear heteroalkylenes, fluorinated branched heteroalkylenes, fluorinated cyclic heteroalkylenes, fluorinated polycyclic heteroalkylenes, fluorinated ester groups, fluorinated carbonyl groups, fluorinated carbonate groups, fluorinated acetal groups, fluorinated ketal groups, fluorinated siloxyl groups, fluorinated carboxylic acid groups, fluorinated carboxylic acid anhydride groups, fluorinated carboxylic acid anhydride half-ester groups, fluorinated ether groups, fluorinated amide groups, fluorinated carbamate groups, and fluorinated thioether groups;

wherein $R_1$ is selected from the group consisting of a fluoroalcohol group, a fluoroalcohol group protected with an acid-labile group, a fluoroalcohol group protected with a base-labile group, a fluoroalcohol group protected with an acid-labile fluorinated group, a fluoroalcohol group protected with a base-labile fluorinated group, and an —$X_1$—$Y_1$ group wherein $X_1$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_1$ is selected from the group consisting of a fluoroalcohol group, a fluoroalcohol group protected with an acid-labile group a fluoroalcohol group protected with a base-labile group, a fluoroalcohol group protected with an acid-labile fluorinated group, and a fluoroalcohol group protected with a base-labile fluorinated group;

wherein $R_2$ is selected from the group consisting of hydrogen, fluorine, a fluoroalcohol group, a sulfonamide group, a phenolic group, a naphtholic group, a carboxylic acid group and a sulfonic acid group and an —$X_2$—$Y_2$ group wherein $X_2$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups amide groups, ether groups, thioether groups, carbonate groups, carbamate groups, acetal groups, ketal groups and $Y_2$ is selected from the group consisting of a fluoroalcohol group, a sulfonamide group, a phenolic group, a naphtholic group, a carboxylic acid group and a sulfonic acid group;

wherein $R_3$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes and an —$X_3$—$Y_3$ group wherein $X_3$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_3$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes.

Class B polymers may be described as having the structure:

wherein each monomer $B_1$ through $B_N$ is independently selected from the group of monomers consisting of structures VI, VII and VIII described infra. Structure V should not be interpreted as meaning all polymers in a given sample of a class B polymer have the same number of monomer units, but rather M can vary between individual polymers. M could also be thought of as being the average number of polymer units in a given sample of class B polymers.

Class B polymers comprise one or more different monomers selected from the group consisting of:

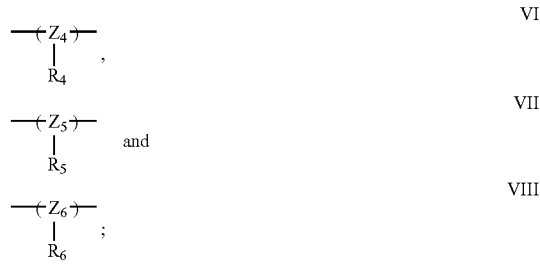

wherein each $Z_4$, $Z_5$, and $Z_6$ is independently selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, carbonate groups, acetal groups, ketal groups, siloxyl groups, carboxylic acid groups, carboxylic acid anhydride groups, carboxylic acid anhydride half-ester groups, ether groups, amide groups, carbamate groups, thioether groups, fluorinated linear alkylenes, fluorinated branched alkylenes, fluorinated cyclic alkylenes, polycyclic alkylenes, fluorinated linear heteroalkylenes, fluorinated branched heteroalkylenes, fluorinated cyclic heteroalkylenes, fluorinated polycyclic heteroalkylenes, fluorinated ester groups, fluorinated carbonyl groups, fluorinated carbonate groups, fluorinated acetal groups, fluorinated ketal groups, fluorinated siloxyl groups, fluorinated carboxylic acid groups, fluorinated carboxylic acid anhydride groups, fluorinated carboxylic acid anhydride half-ester groups, fluorinated ether groups, fluorinated amide groups, fluorinated carbamate groups, and fluorinated thioether groups;

wherein $R_4$ is selected from the group consisting of a sulfonic acid group, a sulfinic acid group, a carboxylic acid group and an —$X_4$—$Y_4$ group wherein $X_4$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_4$ is selected from the group consisting of a sulfonic acid group, a sulfinic acid group, and a carboxylic acid group;

wherein $R_5$ is selected from the group consisting of hydrogen, fluorine, a fluoroalcohol group, a sulfonamide group, a phenolic group, a naphtholic group, a carboxylic acid group and a sulfonic acid group and an —$X_5$—$Y_5$ group wherein $X_5$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_5$ is selected from the group consisting of a fluoroalcohol group, a sulfonamide group, a phenolic group, a naphtholic group, a carboxylic acid group and a sulfonic acid group; and wherein $R_6$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycyclic heteroalkanes and an —$X_6$—$Y_6$ group wherein $X_6$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups, ketal groups and $Y_6$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes.

In one example topcoat mixture, the class A polymer is a terpolymer where $R_1$ is selected to provide solubility in an aqueous base developer and to provide low surface energy, $R_2$ is selected to tune the solubility in aqueous base developer, and $R_3$ is selected to tune the surface energy and the class B polymer is a terpolymer where $R_4$ is a strongly acidic group, $R_5$ is a weak acidic group and $R_6$ is selected to tune the polarity of the class B polymer. As the examples below indicate, topcoat mixtures according to the present invention may be mixtures where the class A polymer is independently selected from the group consisting of homopolymers, copolymers and terpolymers and the class B polymer is independently selected from the group consisting of single monomer polymers, copolymers and terpolymers, as two or more of the properties imparted to the class A polymer by individual $R_1$, $R_2$, $R_3$ groups may be fulfilled by one or two R groups and two or more of the properties imparted to the class B polymer by individual $R_4$, $R_5$, $R_6$ groups may be fulfilled by one or two R groups.

In one example, the average molecular weight for class A and class B polymers is between about 500 and about 200,000. In one example, the average molecular weight for class A and class B polymers is between about 1000 and about 20,000.

Casting mixtures may include, besides class A polymers and class B polymers, casting solvents, surfactants, photoacid generators (PAGs) and polymer bound PAGs.

The examples topcoat mixtures described infra, are intended to provide those of ordinary skill in the art with a complete disclosure and description of how to prepare and use the compositions disclosed and claimed herein. The mixture of A and B type polymers are dissolved in a solvent to form a casting solution. The solvent may comprise one solvent or two or more different volatile solvents. Casting solvents are not included in total solids calculations. Further, stabilizers, surfactants and other additives (if any) may be added to the casting solution. In one example, surfactants comprise less than about 1 percent by weight of the totals solids content of the casting solution. In one example, stabilizers and other additives together comprise less than about 10 percent by weight of the total solids content of the casting solution. In a first example, type A and type B polymers together comprise between about 5 percent by weight to about 10 percent by weight of the casting solution. In a second example, type A and type B polymers together comprise between about 2 percent by weight to about 15 percent by weight of the casting solution. In a third example, type A and type B polymers together comprise up to about 30 percent by weight of the casting solution. Casting solutions may be made by adding dry (e.g., in powder form) type A and type B polymers to the casting solvent. Solvent extraction may be used to purify type A and type B polymers and then the solutions with the polymer (with or without a concentration procedure) mixed together to form a simple casting solution. Surfactants, stabilizers and other additives may be added to the simple casting solution as solids or as solutions of dissolved solids to form a more complex casting solution. It is important to note that additives and impurities that will stop formation of a vertically graded non-homogenous layer of type A and B polymers are excluded from being included or added to the casting solution.

Unless indicated otherwise, parts are parts by weight, temperature is in ° C. and pressure is at or near atmospheric. 3,5-Bis(1,1,1,3,3,3-hexafluoro-2-hydroxypropan-2-yl)cyclohexyl methacrylate, 1-cyclohexyl-4,4,4-trifluoro-3-hydroxy-3-(trifluoromethyl)but-1-yl methacrylate, and 2-(1,1,1,3,3,3-hexafluoro-2-hydroxypropan-2-yl)cyclohexyl methacrylate were obtained from Central Glass (Japan). Additionally, all the other starting materials were obtained commercially or were synthesized using known procedures.

Where appropriate, the following techniques and equipment were utilized in the examples: $^1$H and $^{13}$C NMR spectra were obtained at room temperature on an Avance 400 spectrometer. Thermo-gravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000 or Nanospec. A quartz crystal microbalance (QCM) with a MAXTEC Inc. PLO-10 Phase lock oscillator was used to study the dissolution kinetics of the resist films in an aqueous 0.26N tetramethylammonium hydroxide (TMAH) solution (CD-26). Lithographic evaluation was performed on a 0.6N 193 nm mini-stepper, dry exposure tool or a 193 nm interferometric exposure tool.

Water contact angles were measured on an OCA video based contact angle system from FDS Future Digital Scientific Corporation, using the sessile drop method on polymer mixtures after baking to drive out the casting solvent. The contact angle reported is the angle between the solid surface on which the drop is formed and the tangent to the drop surface at the drop surface/solid surface interface. The advancing and receding contact angles were measured using a tilting stage method. Presented static contact angles are a calculated average of between 5 and 10 measurements of a 2 μL deionized water drop. Static contact angles are measured un-tilted, i.e., on a horizontal surface parallel to the ground. Tilting contact angles are measured by placing a 50 μL drop of deionized water on the substrate. The substrate is thereafter tilted in an increasingly vertical direction (relative to the horizontal direction) until the droplet starts moving. The advancing, receding, and tilt angles are measured just before the drop starts moving. Presented advancing and receding water contact angles are calculated from an average of between 3 and 5 measurements.

One of the objectives of using a topcoat is to prevent leaching of extractable components from the photoresist into the immersion liquid. Extraction of resist components into water was evaluated using WEXA (Water Extraction Apparatus, see R. D. Allen et. al., *J. Photopolym. Sci. & Tech.*, 2005, 18 (5), 615-619). Selected materials in the present invention were set in contact with water in a controlled reproducible manner (time, speed, volume, contact area, etc.). The water was thereafter collected and analyzed for extractable components by Exygen Research using LC/MS/MS. Reported is the amount of sulfonate extractable components originating from the PAG (photoacid generator) that is a component of the resist. For ease of understanding, the amount is reported as percent extractables measured using a topcoat covered by the present invention as compared to without using a topcoat. In all cases, the extractable components were much lower after the addition of a topcoat to the resist.

Another objective of a topcoat is to control reflection of the incident radiation at the immersion fluid/photoresist interface (i.e., acting as a top anti-reflective coating). Control of the reflectivity is achieved by tailoring the film thickness and refractive indices (n and k) to minimize reflectivity (or reduce it below an acceptable level) across the entire range of incident angles experienced with that particular imaging system. Multiple layer film stacks can be used to control reflectivity more efficiently than a single layer system at larger incident angles; however, it is difficult to create multi-layer polymer films due to the need to find orthogonal solvent systems such that the coating solvent of each layer will not dissolve the underlying previously cast polymer layer. The graded film structure in the present invention is ideal for controlling reflectivity as well if the refractive indices of the Class A and Class B polymers are tailored appropriately. For example, a Class A polymer with a refractive index similar to that of the immersion fluid and a Class B polymer with a refractive index to the photoresist would help minimize reflection at the immersion fluid/topcoat interface and the topcoat/photoresist interface, respectively. In addition, the ratios of the two polymers and the overall film thickness can be optimized to provide a good immersion topcoat with anti-reflective properties.

EXAMPLES

A representative polymerization procedure for the Class A and Class B polymers is as follows: to a 100 mL round-bottom flask, monomer (1 equiv.), 2,2'-azobis(2-methylpropionitrile) (AIBN) (0.04 equiv.), 1-dodecanethiol (0.03 equiv.) were added. Anhydrous, inhibitor-free tetrahydrofuran was added to afford about 25 percent by weight solids solution. A reflux condenser with a rubber septum was added and the oxygen was removed from the solution by three sequential pump-backfill cycles using nitrogen and vigorous stirring. The reaction was heated to reflux overnight. The reaction mixture was concentrated under vacuum and a small amount of acetone was added. The polymer solution was precipitated into a non-solvent (typically, hexane or methanol). The polymer was isolated and washed with excess non-solvent using a glass-fritted filter. The polymer was dried under vacuum overnight between 60° C. to 80° C., after which time, it was allowed to cool to room temperature under vacuum. In the examples that follow, the full name, abbreviated name and structure of the polymer is given.

Example Polymer Structures

Examples 1 through 17 are class A polymers and examples 18 through 48 are class B polymers.

Example 1

Poly(1,1,1-trifluoro-2-(trifluoromethyl)-pentan-2-ol-4-yl methacrylate) (iPrHFAMA) Comprises Repeat Units Having The Structure

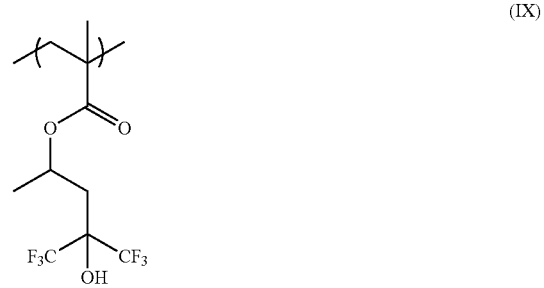

(IX)

Examples 2 and 3

Poly((1,1,1-trifluoro-2-(trifluoromethyl)-pentan-2-ol-4-yl methacrylate)-co-(1,1,1,3,3,3-hexafluoropropan-2-yl methacrylate)) (iPrHFAMA/HFIPMA) Comprises Repeat Units Having the Structures

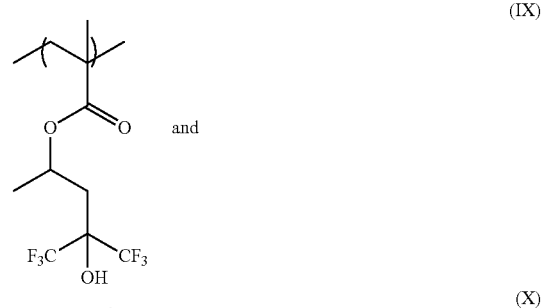

(IX)

and

(X)

Example 2: 95 mer % (IX) and 5 mer %, (X).
Example 3: 80 mer % (IX) and 20 mer %, (X).

Other polymers according to the present invention may include any combination of Y mer % (IX) and Z mer % (X) wherein Y=any number from 0 to 100 and Z=any number from 0 to 100 such that Y+Z is greater than or equal to 50 and less than or equal to 100.

The structure of examples 2 and 3 should be interpreted as representing a polymer $-(A_1-A_2-A_3 \ldots A_N)-$ where $A_1$ through $A_N$ are independently selected from the group consisting of iPrHFAMA and HFIPMA repeat units but in the mer percentages given for each example. A mer is defined as a chemical repeat unit in the polymer. Mer fraction is defined as the number of mers of a given repeat unit divided by the number of mers of all repeat units in a polymer. Mer % is defined as the mer fraction multiplied by 100. The total amount of all mers is thus 100 mer %. (In example 1, there is only iPrHFAMA so 100 mer % of all repeat units are iPrHFAMA.) For example 2, in the iPrHFAMA/HFIPMA copolymer there are 95 mers of iPrHFAMA for every 5 mers of HFIPMA. Thus example 2 is 95 mer % iPrHFAMA and 5 mer % HFIPMA. For example 3, in the iPrHFAMA/HFIPMA copolymer there are 80 mer of iPrHFAMA for every 20 mers of HFIPMA mers. Thus example 3 is 80 mer % iPrHFAMA and 20 mer % HFIPMA. These definitions are applicable to all examples described infra with the proviso that for class B polymers the general formula $-(B_1-B_2-B_3 \ldots B_N)-$ should be used. Examples 1 through 17 are class A polymers and examples 18 through 48 are class B polymers.

Example 4

Poly(1,1,1-trifluoro-2-(trifluoromethyl)-hexan-2-ol-4-yl methacrylate) (EtiPrHFAMA) Comprises Repeat Units Having the Structure

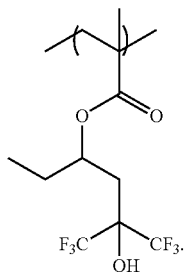

(XI)

Example 5

Poly(1,1,1-trifluoro-5-methyl-2-(trifluoromethyl)-hexan-2-ol-4-yl methacrylate) (iPriPrHFAMA) Comprises Repeat Units Having the Structure

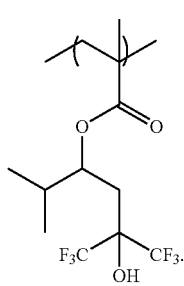

(XII)

Examples 6 and 7

Poly((1,1,1-trifluoro-5-methyl-2-(trifluoromethyl)-hexan-2-ol-4-yl methacrylate)-co-(2-(trifluoromethylsulfonamido)ethyl methacrylate)) (iPriPrHFAMA/STAR) Comprises Repeat Units Having the Structures

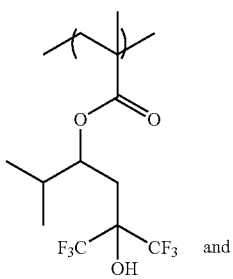

(IV) and

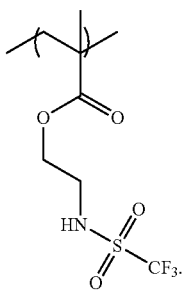

(XIII)

Example 6: 90 mer % (XII) and 10 mer % (XIII).

Example 7: 80 mer % (XII) and 20 mer % (XIII).

Other polymers according to the present invention may include any combination of Y mer % (XII) and Z mer % (XIII) wherein Y=any number from 0 to 100 and Z=any number from 0 to 100 such that Y+Z is greater than or equal to 50 and less than or equal to 100.

Example 8

Poly((1,1,1-trifluoro-5,5-dimethyl-2-(trifluoromethyl)-hexan-2-ol-4-yl methacrylate)-co-(2-(trifluoromethylsulfonamido)ethyl methacrylate)) (tBuiPrHFAMA/STAR) Comprises Repeat Units Having the Structures

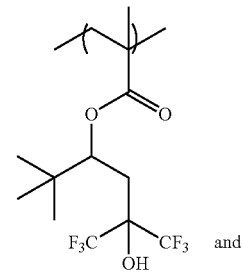

(XIV) and

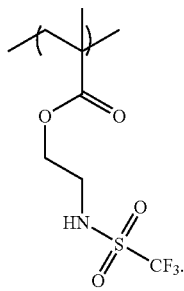
(V)

Example 8: 70 mer % (XIV) and 30 mer % (XII).

Other polymers according to the present invention may include any combination of Y mer % (XIV) and Z mer % (XIII) wherein Y=any number from 0 to 100 and Z=any number from 0 to 100 such that Y+Z is greater than or equal to 50 and less than or equal to 100.

Example 9

Poly(1,1,1-trifluoro-2-(trifluoromethyl)-4-cyclohexyl-butan-2-ol-4-yl methacrylate) (CHiPrHFAMA) Comprises Repeat Units Having the Structure

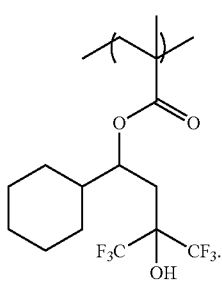
(XV)

Example 10

Poly((1,1,1-trifluoro-2-(trifluoromethyl)-4-cyclohexyl-butan-2-ol-4-yl methacrylate)-co-(1,1,1-trifluoro-2-(trifluoromethyl)-pentan-2-ol-4-yl methacrylate)) (CHiPrHFAMA/iPrHFAMA) Comprises Repeat Units Having the Structures

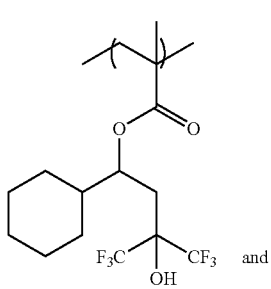
(XV)

and

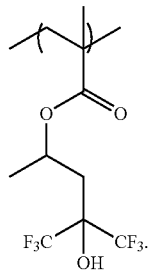
(IX)

Example 10: 50 mer % (XV) and 50 mer % (IX).

Other polymers according to the present invention may include any combination of Y mer % (XV) and Z mer % (IX) wherein Y=any number from 0 to 100 and Z=any number from 0 to 100 such that Y+Z is greater than or equal to 50 and less than or equal to 100.

Examples 11 and 12

Poly((1,1,1-trifluoro-2-(trifluoromethyl)-4-cyclohexyl-butan-2-ol-4-yl methacrylate)-co-(2-(trifluoromethylsulfonamido)ethyl methacrylate)) (CHiPrHFAMA/STAR) Comprises Repeat Units Having the Structures

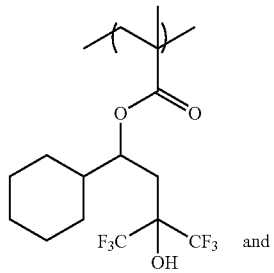
(XV)

and

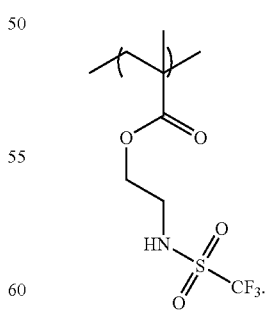
(XIII)

Example 11: 80 mer % (XV) and 20 mer % (XIII).
Example 12: 70 mer % (XV) and 30 mer % (XIII).

Other polymers according to the present invention may include any combination of Y mer % (XV) and Z mer % (XIII)

wherein Y=any number from 0 to 100 and Z=any number from 0 to 100 such that Y+Z is greater than or equal to 50 and less than or equal to 100.

Example 13

Poly((1,1,1-trifluoro-2-(trifluoromethyl)-4-cyclohexyl-butan-2-ol-4-yl methacrylate)-co-(methacrylic acid)) (CHiPrHFAMA/MAA) Comprises Repeat Units Having the Structures

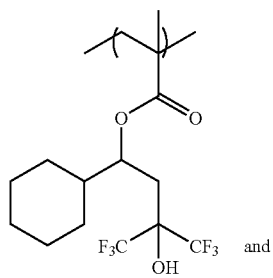

(XV)

and

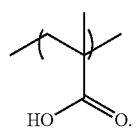

(XVI)

Example 13: 90 mer % (XV) and 10 mer % (XVI).

Other polymers according to the present invention may include any combination of Y mer % (XV) and Z mer % (XVI) wherein Y=any number from 0 to 100 and Z=any number from 0 to 100 such that Y+Z is greater than or equal to 50 and less than or equal to 100.

Examples 14 and 15

Poly((1,1,1-trifluoro-2-(trifluoromethyl)-4-cyclohexyl-butan-2-ol-4-yl methacrylate)-co-(3,5-bis(1,1,1,3,3,3-hexafluoroproan-2-ol-2-yl)cyclohex-1-yl methacrylate)) (CHiPrHFAMA/BisHFACHMA) Comprises Repeat Units Having the Structures

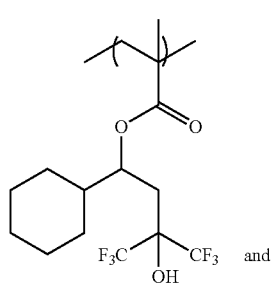

(XV)

and

-continued

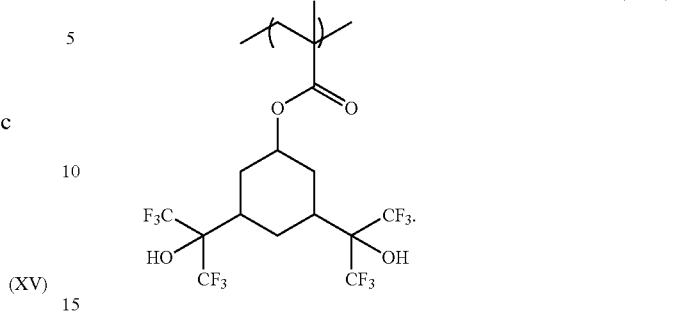

(XVII)

Example 14: 80 mer % (XV) and 20 mer % (XVII).

Example 15: 70 mer % (XV) and 30 mer % (XVII).

Other polymers according to the present invention may include any combination of Y mer % (XV) and Z mer % (XVII) wherein Y=any number from 0 to 100 and Z=any number from 0 to 100 such that Y+Z is greater than or equal to 50 and less than or equal to 100.

Example 16

Poly(1,1,1-trifluoro-2-(trifluoromethyl)-hexan-2-ol-4-yl methacrylate)-co-(2-(methacryloyloxy)ethanesulfonic acid)) (EtiPrHFAMA/SEMA) Comprises Repeat Units Having the Structures

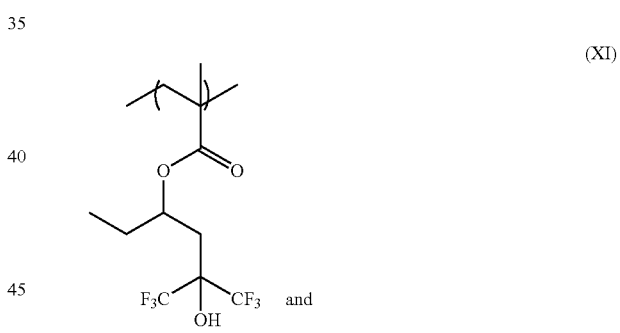

(XI)

and

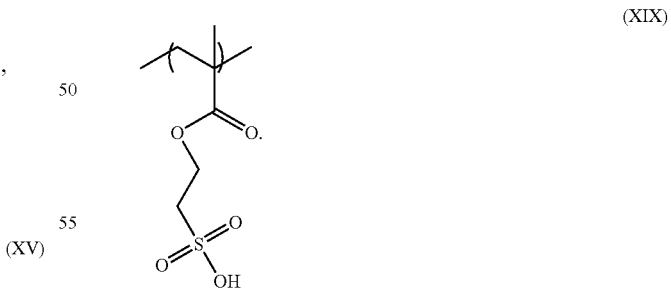

(XIX)

Example 16: 98 mer % (XI) and 2 mer %, (XIX).

Other polymers according to the present invention may include any combination of Y mer % (IX) and Z mer % (XIX) wherein Y=any number from 0 to 99.9, Z=any number from 0.1 to 100 such that Y+Z is greater than or equal to 50 and less than or equal to 100.

Example 17
Poly((1,1,1-trifluoro-5-methyl-2-(trifluoromethyl)-hexan-2-ol-4-yl methacrylate)-co-(2-(methacryloyloxy)ethanesulfonic acid))-co-(2-(trifluoromethylsulfonamido)ethyl methacrylate)) (iPriPrHFAMA/SEMA/STAR) Comprises Repeat Units Having the Structures

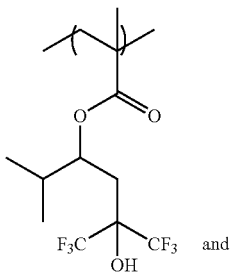
and
(XIX)

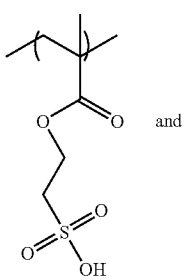
and
(XIII)

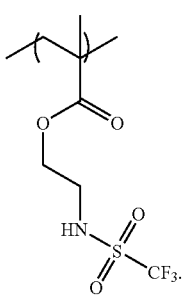
(XII)

Example 17: 80 mer % (XII), 2 mer % (XIX) and 18 mer % (XIII).

Other polymers according to the present invention may include any combination of W mer % (IV), Y mer % (XIX) and Z mer % (XIII) wherein W=any number from 0 to 99.9, Y=any number from 0.1 to 99.9, Z=any number from 0 to 99.9 such that W+Y+Z is greater than or equal to 50 and less than or equal to 100.

Examples 18 and 19
Poly((1,1,1-trifluoro-2-(trifluoromethyl)-pentan-2-ol-4-yl methacrylate)-co-(2-acrylamido-2-methyl-propane-1-sulfonic acid)) (iPrHFAMA/MVP) Comprises Repeat Units Having the Structures

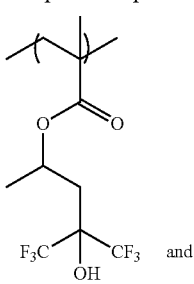
and
(IX)

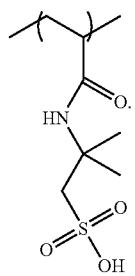
(XVIII)

Example 18: 97.5 mer % (IX) and 2.5 mer % (XVIII).
Example 19: 95 mer % (IX) and 5 mer % (XVIII).

Other polymers according to the present invention may include any combination of Y mer % (IX) and Z mer % (XVIII) wherein Y=any number from 0 to 99.9 and Z=any number from 0.1 to 100 such that Y+Z is greater than or equal to 50 and less than or equal to 100.

Examples 20-23
Poly((1,1,1-trifluoro-2-(trifluoromethyl)-pentan-2-ol-4-yl methacrylate)-co-(2-(methacryloyloxy)ethanesulfonic acid)) (iPrHFAMA/SEMA) Comprises Repeat Units Having the Structures

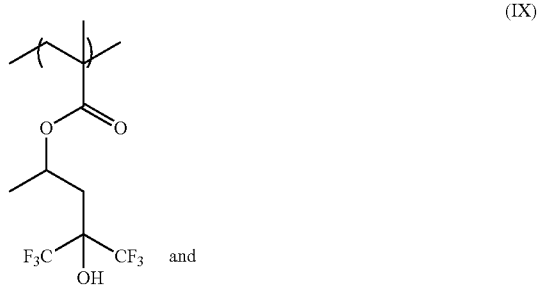
and
(IX)

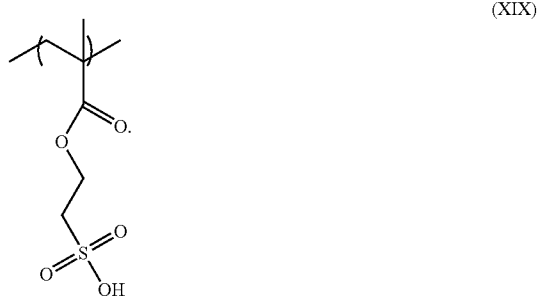
(XIX)

Example 20: 99 mer % (IX) and 1 mer %, (XIX).
Example 21: 97.5 mer % (IX) and 2.5 mer %, (XIX).
Example 22: 95 mer % (IX) and 5 mer %, (XIX).
Example 23: 92.5 mer % (IX) and 7.5 mer %, (XIX).

Other polymers according to the present invention may include any combination of Y mer % (IX) and Z mer % (XIX)

wherein Y=any number from 0 to 99.9, Z=any number from 0.1 to 100 such that Y+Z is greater than or equal to 50 and less than or equal to 100.

Examples 24-27

Poly((1,1,1-trifluoro-2-(trifluoromethyl)-pentan-2-ol-4-yl methacrylate)-co-(2-(methacryloyloxy)ethanesulfonic acid)-co-(methyl methacrylate)) (iPrHFAMA/SEMA/MMA) Comprises Repeat Units Having the Structures

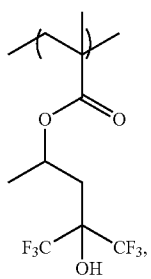

(IX)

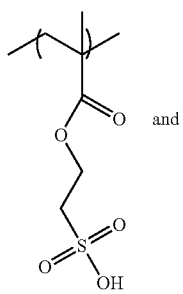

(XIX)

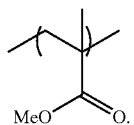

(XX)

Example 24: 85 mer % (IX), 5 mer % (XIX) and 10 mer % (XX).
Example 25: 75 mer % (IX), 5 mer % (XIX) and 20 mer % (XX).
Example 26: 65 mer % (IX), 5 mer % (XIX) and 30 mer % (XX).
Example 27: 55 mer % (IX), 5 mer % (XIX) and 40 mer % (XX).

Other polymers according to the present invention may include any combination of W mer % (IX), Y mer % (XIX) and Z mer % (XX) wherein W=any number from 0 to 99.9, Y=any number from 0.1 to 99.9, Z=any number from 0 to 99.9 such that W+Y+Z is greater than or equal to 50 and less than or equal to 100.

Examples 28 and 29

Poly((1,1,1-trifluoro-2-(trifluoromethyl)-pentan-2-ol-4-yl methacrylate)-co-(2-(methacryloyloxy)ethanesulfonic acid)-co-(isobornyl methacrylate)) (iPrHFAMA/SEMA/IBOMA) Comprises Repeat Units Having the Structures

(IX)

(XIX)

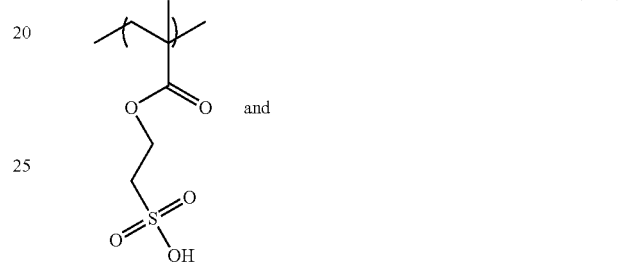

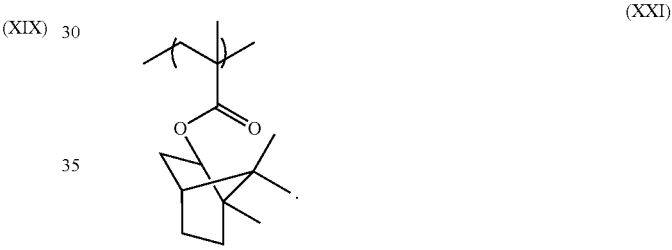

(XXI)

Example 28: 75 mer % (IX), 5 mer % (XIX) and 20 mer % (XXI).
Example 29: 55 mer % (IX), 5 mer % (XIX) and 40 mer % (XXI).

Other polymers according to the present invention may include any combination of W mer % (IX), Y mer % (XIX) and Z mer % (XXI) wherein W=any number from 0 to 99.9, Y=any number from 0.1 to 99.9, Z=any number from 0 to 99.9 such that W+Y+Z is greater than or equal to 50 and less than or equal to 100.

Example 30

Poly((2-(trifluoromethylsulfonamido)ethyl methacrylate)-co-(2-(methacryloyloxy)ethanesulfonic acid)) (STAR/SEMA) Comprises Repeat Units Having the Structures

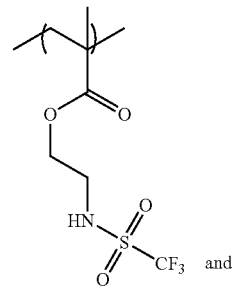

(XIII)

-continued

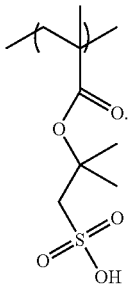
(XIX)

Example 28: 95 mer % (XIII) and 5 mer % (XIX).

Other polymers according to the present invention may include any combination of Y mer % (XIII) and Z mer % (XIX) wherein Y=any number from 0 to 99.9 and Z=any number from 0.1 to 100 such that Y+Z is greater than or equal to 50 and less than or equal to 100.

Examples 31-34

Poly((2-(trifluoromethylsulfonamido)ethyl methacrylate)-co-(2-(methacryloyloxy)ethanesulfonic acid)-co-(isobornyl methacrylate)) (STAR/SEMA/IBOMA) Comprises Repeat Units Having the Structures

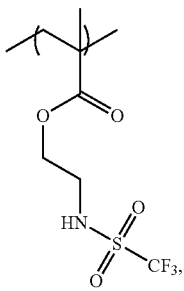
(XIII)

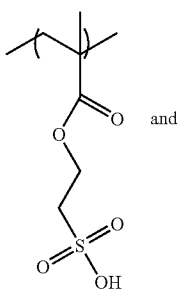
and
(XIX)

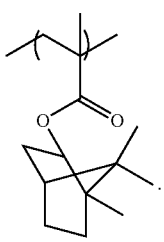
(XXI)

Example 31: 75 mer % (XIII), 5 mer % (XIX) and 20 mer % (XXI).

Example 32: 55 mer % (XIII), 5 mer % (XIX) and 40 mer % (XXI).

Example 33: 67.5 mer % (XIII), 2.5 mer % (XIX) and 30 mer % (XXI).

Example 34: 57.5 mer % (XIII), 2.5 mer % (XIX) and 40 mer % (XXI).

Other polymers according to the present invention may include any combination of W mer % (XIII), Y mer % (XIX) and Z mer % (XXI) wherein W=any number from 0 to 99.9, Y=any number from 0.1 to 99.9, Z=any number from 0 to 99.9 such that W+Y+Z is greater than or equal to 50 and less than or equal to 100.

Examples 35-36

Poly((2-(trifluoromethylsulfonamido)ethyl methacrylate)-co-(vinyl sulfonic acid)-co-(isobornyl methacrylate)) (STAR/VSA/IBOMA) Comprises Repeat Units Having the Structures

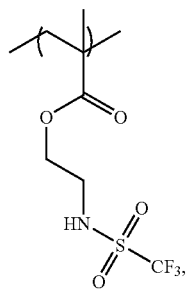
(XIII)

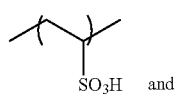
and
(XXII)

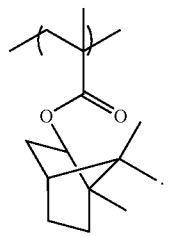
(XXI)

Example 35: 67.5 mer % (XIII), 2.5 mer % (XXII) and 30 mer % (XXII).

Example 36: 57.5 mer % (XIII), 2.5 mer % (XXII) and 40 mer % (XXII).

Other polymers according to the present invention may include any combination of W mer % (XII), Y mer % (XXII) and Z mer % (XXI) wherein W=any number from 0 to 99.9, Y=any number from 0.1 to 99.9, Z=any number from 0 to 99.9 such that W+Y+Z is greater than or equal to 50 and less than or equal to 100.

Examples 37-38

Poly((2-(trifluoromethylsulfonamido)ethyl methacrylate)-co-(vinyl sulfonic acid)-co-(isobornyl methacrylate)) (STAR/VSA/IBOMA) Comprises Repeat Units Having the Structures

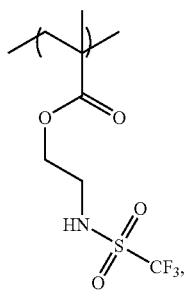

(XII)

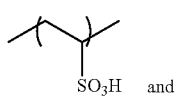

and (XXII)

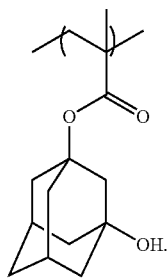

(XXIII)

Example 37: 67.5 mer % (XIII), 2.5 mer % (XXII) and 30 mer % (XXIII).

Example 38: 57.5 mer % (XIII), 2.5 mer % (XXII) and 40 mer % (XXIII).

Other polymers according to the present invention may include any combination of W mer % (XIII), Y mer % (XXII) and Z mer % (XXIII) wherein W=any number from 0 to 99.9, Y=any number from 0.1 to 99.9, Z=any number from 0 to 99.9 such that W+Y+Z is greater than or equal to 50 and less than or equal to 100.

Examples 39-40

Poly((methacrylic acid)-co-(2-(methacryloyloxy) ethanesulfonic acid)-co-(isobornyl methacrylate)) (MAA/SEMA/IBOMA) Comprises Repeat Units Having the Structures

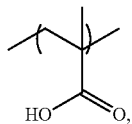

(XVI)

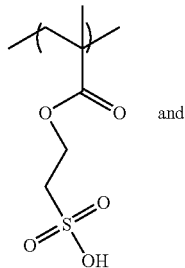

(XIX)

and

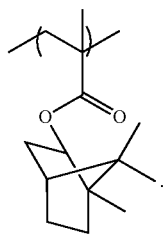

(XXI)

Example 39: 60 mer % (XVI), 2.5 mer % (XIX) and 37.5 mer % (XXI).

Example 40: 50 mer % (XVI), 2.5 mer % (XIX) and 47.5 mer % (XXI).

Example 41: 40 mer % (XVI), 2.5 mer % (XIX) and 57.5 mer % (XXI).

Example 42: 30 mer % (XVI), 2.5 mer % (XIX) and 67.5 mer % (XXI).

Other polymers according to the present invention may include any combination of W mer % (XVI), Y mer % (XIX) and Z mer % (XXI) wherein W=any number from 0 to 99.9, Y=any number from 0.1 to 99.9, Z=any number from 0 to 99.9 such that W+Y+Z is greater than or equal to 50 and less than or equal to 100.

Examples 43-46

Poly((methacrylic acid)-co-(2-(methacryloyloxy) ethanesulfonic acid)-co-(methyl methacrylate)) (MAA/SEMA/MMA) Comprises Repeat Units Having the Structures

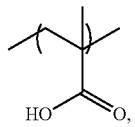

(XVI)

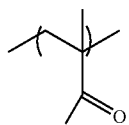

(XIX)

and

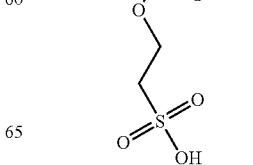

-continued

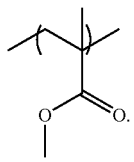
(XXIV)

Example 43: 50 mer % (XVI), 2.5 mer % (XIX) and 47.5 mer % (XXIV).

Example 44: 40 mer % (XVI), 2.5 mer % (XIX) and 57.5 mer % (XXIV).

Example 45: 30 mer % (XVI), 2.5 mer % (XIX) and 67.5 mer % (XXIV).

Example 46: 20 mer % (XVI), 2.5 mer % (XIX) and 77.5 mer % (XXIV).

Other polymers according to the present invention may include any combination of W mer % (XVI), Y mer % (XIX) and Z mer % (XXIV) wherein W=any number from 0 to 99.9, Y=any number from 0.1 to 99.9, Z=any number from 0 to 99.9 such that W+Y+Z is greater than or equal to 50 and less than or equal to 100.

Examples 47-48

Poly((methacrylic acid)-co-(2-vinyl sulfonic acid)-co-(methyl methacrylate)) (MAA/VSAA/MMA) Comprises Repeat Units Having the Structures

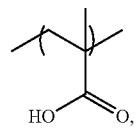
(XVI)

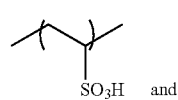
(XXII)

and

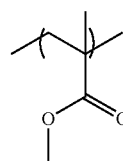
(XXIV)

Example 47: 30 mer % (XVI), 2.5 mer % (XXII) and 67.5 mer % (XXIV).

Example 48: 20 mer % (XVI), 2.5 mer % (XXII) and 77.5 mer % (XXIV).

Other polymers according to the present invention may include any combination of W mer % (XVI), Y mer % (XXII) and Z mer % (XXIV) wherein W=any number from 0 to 99.9, Y=any number from 0.1 to 99.9, Z=any number from 0 to 99.9 such that W+Y+Z is greater than or equal to 50 and less than or equal to 100.

TABLE I lists the properties of the exemplary Class A and Class B polymers described supra.

TABLE I

| Polymer | Polymer | Composition | $M_n$ | PDI | $\theta_{static}$ [°] | $\theta_{advancing}$ [°] | $\theta_{receding}$ [°] | $\theta_{tilt}$ [°] | Dissolution Rate [nm/s] |
|---|---|---|---|---|---|---|---|---|---|
| Class A | | | | | | | | | |
| 1 | iPrHFAMA | | 4220 | 1.56 | 82.9 | 87.2 | 65.6 | 20.5 | 125 |
| 2 | iPrHFAMA/HFIPMA | 95:5 | 5790 | 1.44 | 85.4 | 87.6 | 67.6 | 18.0 | 45 |
| 3 | iPrHFAMA/HFIPMA | 80:20 | 5340 | 1.44 | 87.9 | 89.1 | 69.4 | 17.8 | 5.5 |
| 4 | EtiPrHFAMA | | 5260 | 1.68 | 88.2 | 90.1 | 71.9 | 16.0 | 6.6 |
| 5 | iPriPrHFAMA | | 6720 | 1.34 | 93.2 | 93.3 | 79.6 | 12.4 | <0.1 |
| 6 | iPriPrHFAMA/STAR | 90:10 | 3990 | 1.61 | 90.7 | 92.2 | 74.7 | 15.5 | 0.9 |
| 7 | iPriPrHFAMA/STAR | 80:20 | 4430 | 1.67 | 89.6 | 92.1 | 72.9 | 18.0 | 10.4 |
| 8 | tBuiPrHFAMA/STAR | 70:30 | 2870 | 1.46 | 87.0 | 94.3 | 65.6 | 23.6 | 25 |
| 9 | CHiPrHFAMA | | 5900 | 1.33 | 95.9 | 92.7 | 78.7 | 14.4 | <0.01 |
| 10 | CHiPrHFAMA/ iPrHFAMA | 50:50 | 6530 | 1.36 | 89.1 | 89.3 | 74.2 | 13.8 | <0.1 |
| 11 | CHiPrHFAMA/STAR | 80:20 | 5630 | 1.29 | 91.8 | 91.2 | 73.5 | 15.4 | <0.1 |
| 12 | CHiPrHFAMA/STAR | 70:30 | 6150 | 1.32 | 90.3 | 90.7 | 71.3 | 17.6 | 2.5 |
| 13 | CHiPrHFAMA/MAA | 90:10 | 4200 | 1.61 | 71.6 | 93.0 | 75.3 | 15.5 | <0.1 |
| 14 | CHiPrHFAMA/ BisHFACHMA | 80:20 | 6700 | 1.31 | 87.3 | 88.8 | 72.8 | 14.4 | <0.1 |
| 15 | CHiPrHFAMA/ BisHFACHMA | 70:30 | 6920 | 1.32 | 83.3 | 86.9 | 70.6 | 14.9 | 0.3 |
| 16 | EtiPrHFAMA/SEMA | 98:2 | 3851 | 1.59 | 83.2 | 89.5 | 66.9 | 22.6 | 14.0 |
| 17 | iPriPrHFAMA/SEMA/ STAR | 80:2:18 | 3932 | 1.50 | 84.8 | 91.5 | 66.8 | 24.6 | 14.0 |

TABLE I-continued

| Polymer | Polymer | Composition | $M_n$ | PDI | $\theta_{static}$ [°] | $\theta_{advancing}$ [°] | $\theta_{receding}$ [°] | $\theta_{tilt}$ [°] | Dissolution Rate [nm/s] |
|---|---|---|---|---|---|---|---|---|---|
| Class B | | | | | | | | | |
| 18 | iPrHFAMA/MVP | 97.5:2.5 | 24600 | 1.54 | 78.8 | 86.1 | 61.5 | 24.8 | 70 |
| 19 | iPrHFAMA/MVP | 95:5 | 15400 | 2.02 | 76.2 | 86.2 | 55.4 | 29.9 | 165 |
| 20 | iPrHFAMA/SEMA | 99:1 | 5260 | 1.41 | 79.9 | 90.1 | 65.7 | 20.9 | — |
| 21 | iPrHFAMA/SEMA | 97.5:2.5 | 4940 | 1.35 | 78.2 | 89.9 | 61.9 | 23.2 | — |
| 22 | iPrHFAMA/SEMA | 95:5/5 | 3480 | 1.28 | 75.9 | 89.9 | 55.6 | 30.9 | — |
| 23 | iPrHFAMA/SEMA | 92.5/7.5 | 4260 | 1.28 | 76.6 | 83.7 | 55.6 | 26.3 | 280 |
| 24 | iPrHFAMA/SEMA/MMA | 85:5:10 | 3670 | 1.39 | 75.7 | 85.6 | 53.8 | 29.4 | 220 |
| 25 | iPrHFAMA/SEMA/MMA | 75:5:20 | 2540 | 1.42 | 75.2 | 85.5 | 53.0 | 30.4 | 150 |
| 26 | iPrHFAMA/SEMA/MMA | 65:5:30 | 2160 | 1.61 | 74.4 | 84.7 | 50.7 | 31.3 | 80 |
| 27 | iPrHFAMA/SEMA/MMA | 55:5:40 | 2800 | 1.38 | 73.5 | 84.7 | 49.9 | 32.7 | 50 |
| 28 | iPrHFAMA/SEMA/IBOMA | 75:5:20 | 5140 | 1.21 | 76.7 | 86.4 | 54.0 | 30.1 | 44 |
| 29 | iPrHFAMA/SEMA/IBOMA | 55:5:40 | 4386 | 1.37 | 78.2 | 88.6 | 54.0 | 32.1 | 0 |
| 30 | STAR/SEMA | 95:5 | 3382 | 1.37 | 72.8 | 83.1 | 38.1 | 41.8 | 3500 |
| 31 | STAR/SEMA/IBOMA | 75:5:20 | 3811 | 1.27 | 69.2 | 82.9 | 34.3 | 44.2 | 2220 |
| 32 | STAR/SEMA/IBOMA | 55:5:40 | 3867 | 1.30 | 67.7 | 81.6 | 29.3 | 47.9 | 525 |
| 33 | STAR/SEMA/IBOMA | 67.5:2.5:30 | 3550 | 1.67 | 73.0 | 83.4 | 42.1 | 37.9 | 570 |
| 34 | STAR/SEMA/IBOMA | 57.5:2.5:40 | 3600 | 1.68 | 73.9 | 83.6 | 44.0 | 36.2 | 170 |
| 35 | STAR/VSA/IBOMA | 67.5:2.5:30 | 5241 | 1.59 | 74.9 | 84.3 | 48.5 | 34.7 | 900 |
| 36 | STAR/VSA/IBOMA | 57.5:2.5:40 | 7495 | 1.29 | 73.3 | 82.9 | 42.5 | 38.4 | 780 |
| 37 | STAR/VSA/HAdMA | 67.5:2.5:30 | 5252 | 1.55 | 66.6 | 78.3 | 39.9 | 36.2 | 1600 |
| 38 | STAR/VSA/HAdMA | 57.5:2.5:40 | 5566 | 1.67 | 64.5 | 76.7 | 37.2 | 37.2 | 1400 |
| 39 | MAA/SEMA/IBOMA | 60:2.5:37.5 | 3820 | 1.53 | — | — | — | — | 4850 |
| 40 | MAA/SEMA/IBOMA | 50:2.5:47.5 | 4200 | 1.56 | — | — | — | — | swells |
| 41 | MAA/SEMA/IBOMA | 40:2.5:57.5 | 3490 | 1.63 | 67.2 | 83.6 | 29.9 | 51.1 | insol. |
| 42 | MAA/SEMA/IBOMA | 30:2.5:67.5 | 3150 | 1.71 | 71.3 | 86.4 | 38.7 | 43.7 | insol. |
| 43 | MAA/SEMA/MMA | 50:2.5:47.5 | 2920 | 1.46 | — | — | — | — | 5100 |
| 44 | MAA/SEMA/MMA | 40:2.5:57.5 | 3023 | 1.45 | 50.9 | 68.1 | 12.4 | 45.9 | 5000 |
| 45 | MAA/SEMA/MMA | 30:2.5:67.5 | 2540 | 1.35 | — | — | — | — | 3775 |
| 46 | MAA/SEMA/MMA | 20:2.5:77.5 | 2650 | 1.37 | 54.1 | 72.2 | 20.7 | 45.4 | 860 |
| 47 | MAA/VSA/MMA | 30:2.5:67.5 | 6404 | 1.76 | 55.7 | 67.1 | 22.4 | 39.7 | 3760 |
| 48 | MAA/VSA/MMA | 20:2.5:77.5 | 5462 | 1.76 | 56.2 | 68.6 | 31.6 | 33.7 | 540 |

In Table I, the composition is in mer %, $M_n$ is the number average molecular weight, PDI is the polydispersity index, $\theta_{advancing}$ is measured from the front end of the drop (i.e., the edge of the meniscus on the lower end of the tilted stage where the drop will cover previously uncovered surface when it starts sliding), $\theta_{receding}$ is measured from the rear of the drop (i.e., the edge of the meniscus on the elevated side of the tilted stage where the drop will uncover previously covered surface when it starts sliding), $\theta_{tilt}$ is the maximum stage angle before the drop moves, and dissolution rate is in 0.26N tetramethylammonium hydroxide solution.

Blending conventional base-soluble fluorinated topcoat polymers does not successfully create a graded topcoat film. All examples 49 and higher are blended mixtures of class A and class B polymers. In Table II, iPrHFAMA (Example 1) is used as a base material with varying amounts of a highly fluorinated co-monomer added to create high contact angle of class A polymers or a sulfonic acid-containing co-monomer to create an acidic class B polymer. The mixtures 49 through 55 were made by blending dry class A and class B polymers together and then dissolving the dry mixture in a casting solvent. The ratio (A:B) in the following tables is the weight of polymer A to the weight of polymer B in the mixture.

To quantify the extent of increased polymer concentration gradients, the difference ($\Delta\theta_{receding}$) between the experimentally determined receding contact angle and that calculated from a theoretical homogeneous film formed from the same two materials was calculated. The calculation was based on the receding contact angles of the individual polymers and weighted by their their weight fractions per the equation (1):

$$\Delta\theta_{receding} = \theta_r^{expt} - \theta_r^{homogeneousblend} = \theta_r^{expt} - [w^A \theta_r^A + w^B \theta_r^B] \quad (1)$$

where $\Delta\theta_{receding}$ is the difference between the measured contact angle and that calculated for a homogeneous film of class A and class B polymers;

$\theta_r^{expt}$ is the measured contact angle of the class A and B polymer mixture;

$w^A$ is the weight fraction of class A polymer;

$\theta_r^A$ is the receding contact angle of class A polymer.

$w^B$ is the weight fraction of class B polymer; and $\theta_r^B$ is the receding contact angle of class B polymer.

In terms of immersion lithography, it is desirable to have significantly more class A polymer than class B polymer at the immersion fluid/topcoat interface and to have less class A polymer and more class B polymer at the topcoat/photoresist interface. The more negative the value of $\Delta\theta_{receding}$, the more class B than class A polymer is at the air (later immersion fluid)/topcoat interface (the opposite of the desired condition), a value of 0 for $\Delta\theta_{receding}$ indicates no preferential segregation of the class A polymer to the air (later immersion fluid)/topcoat interface, while a positive value for $\Delta\theta_{receding}$ indicates preferential segregation of the class A polymer to the air (later immersion fluid)/topcoat interface (the desired condition).

The resulting topcoats in Table II exhibit receding contact angles that are insignificantly different from that of homogeneous materials as evidenced by the near zero values of $\Delta\theta_{receding}$ shown in Table II. High positive values of $\Delta\theta_{receding}$ indicate increased polymer concentration gradients have occurred. The near zero values of $\Delta\theta_{receding}$ are because the similarly high levels of fluorination (and similar surface energies) in the blend polymers produce an insufficient driving force for one of the polymers to preferentially enrich the surface of the drop. Although contact angles in the topcoat are higher than that of the sulfonic acid-containing polymer only, this approach will only afford averaged contact angles in the topcoats with no possibility for contact angles as high as the class A polymers. In addition, the local concentration of acidic groups near the photoresist is greatly diluted in a homogeneous film compared to a graded film.

TABLE II

| Example | Class A | Class B | Ratio (A:B) | $\theta_{static}$ [°] | $\theta_{advancing}$ [°] | $\theta_{receding}$ [°] | $\theta_{tilt}$ [°] | $\Delta\theta_{receding}$ [°] | Dissolution Rate [nm/s] |
|---|---|---|---|---|---|---|---|---|---|
| 1 | iPrHFAMA | — | — | 82.9 | 87.2 | 65.6 | 20.5 | — | 125 |
| 2 | iPrHFAMA:HFIPMA (95:5) | — | — | 85.4 | 87.6 | 67.6 | 18.0 | — | 45 |
| 3 | iPrHFAMA:HFIPMA (80:20) | — | — | 87.9 | 89.1 | 69.4 | 17.8 | — | 5.5 |
| 19 | — | iPrHFAMA:MVP (95:5) | — | 76.2 | 86.2 | 55.4 | 29.9 | — | 165 |
| 49 | iPrHFAMA | iPrHFAMA:MVP (95:5) | 1:1 | 78.6 | 85.8 | 61.5 | 21.0 | +1.0 | — |
| 50 | iPrHFAMA | iPrHFAMA:MVP (95:5) | 7:3 | 80.5 | 87.3 | 60.7 | 24.5 | −1.8 | — |
| 51 | iPrHFAMA | iPrHFAMA:MVP (95:5) | 9:1 | 81.2 | 87.3 | 65.3 | 20.5 | +0.7 | — |
| 52 | iPrHFAMA:HFIPMA (95:5) | iPrHFAMA:MVP (95:5) | 1:1 | 79.7 | 86.1 | 61.3 | 23.8 | −0.2 | — |
| 53 | iPrHFAMA:HFIPMA (80:20) | iPrHFAMA:MVP (95:5) | 1:1 | 83.8 | 88.7 | 64.0 | 23.2 | +1.6 | — |
| 54 | iPrHFAMA:HFIPMA (95:5) | iPrHFAMA:MVP (95:5) | 5:1 | 82.4 | 87.0 | 65.7 | 19.8 | +0.1 | — |
| 55 | iPrHFAMA:HFIPMA (80:20) | iPrHFAMA:MVP (95:5) | 5:1 | 87.1 | 89.2 | 68.0 | 19.1 | +0.9 | — |

Examples 49 through 55 measured on $SiO_2$.

A greater mismatch in the degree of fluorination (and surface energy) between the two polymers is required to provide sufficient driving force for preferential segregation of the lower surface energy component to the surface during film formation. The effect of reducing fluorine content in class B polymers is shown in Examples 56-58 of Table III. As the level of fluorine in the class B polymer is decreased (by replacing some fluoroalcohol monomer with methyl methacrylate), the values of $\Delta\theta_{receding}$ change from negative to positive. The +2.3 value of $\Delta\theta_{receding}$ for sample 58 indicates that the class A polymer is slightly enriching the surface of the drop, although this value is close to the error limit of the contact angle measurements.

ideal solution. Even if these materials are blended with a high dissolution rate polymer such that the blend dissolves (examples 59 and 64), these materials might re-precipitate and redeposit elsewhere on the wafer causing imaging defects. Dissolution rates of the individual polymer components greater than about 5 nm/s are preferred to help prevent these classes of defects. To ensure higher dissolution rates for the class A polymers, CHiPrHFAMA was copolymerized with lower contact angle but higher dissolution rate monomers such as STAR (examples 11-12) or BisHFACHMA (examples 14-15). The results for these blended topcoat films are shown in TABLE IV. While moderate levels of surface enrichment of the class A polymer are achieved, example 58 fea-

TABLE III

| Example | Class A | Class B | Ratio (A:B) | $\theta_{static}$ [°] | $\theta_{advancing}$ [°] | $\theta_{receding}$ [°] | $\theta_{tilt}$ [°] | $\Delta\theta_{receding}$ [°] |
|---|---|---|---|---|---|---|---|---|
| 10 | CHiPrHFAMA/iPrHFAMA (50:50) | — | — | 89.1 | 89.3 | 74.2 | 13.8 | — |
| 23 | — | iPrHFAMA/SEMA (95:5) | — | 76.6 | 83.7 | 55.6 | 26.3 | — |
| 25 | — | iPrHFAMA/SEMA/MMA (75:5:20) | — | 75.2 | 85.5 | 53.0 | 30.4 | — |
| 27 | — | iPrHFAMA/SEMA/MMA (55:5:40) | — | 73.5 | 84.7 | 49.9 | 32.7 | — |
| 56 | CHiPrHFAMA/iPrHFAMA (50:50) | iPrHFAMA/SEMA (95:5) | 50:50 | 77.8 | 85.7 | 59.3 | 24.1 | -5.6 |
| 57 | CHiPrHFAMA/iPrHFAMA (50:50) | iPrHFAMA/SEMA/MMA (75:5:20) | 50:50 | 79.4 | 87.0 | 61.1 | 23.5 | -2.5 |
| 58 | CHiPrHFAMA/iPrHFAMA (50:50) | iPrHFAMA/SEMA/MMA (55:5:40) | 50:50 | 81.9 | 88.1 | 64.3 | 22.0 | +2.3 |

Examples 56 through 58 measured on SiO$_2$.

To further increase increased polymer concentration gradients, a further reduction of the fluorine content in the class B polymer is required; however, any further replacement of the fluoroalcohol monomer with methyl methacrylate will result in a material insoluble in aqueous TMAH developer. Table IV gives examples of blends using lower fluorine content class B polymers. Table IV gives examples of blends using lower fluorine content class B polymers using a trifluoromethyl sulfonamide-containing monomer (i.e., STAR), which has a more rapid dissolution rate in developer and a lower fluorine content (and higher surface energy). The high contact angle of CHiPrHFAMA (example 9) and CHiPrHFAMA/iPrHFAMA (example 10) helps increase the overall contact angle of the film; however, the low solubility of these polymers in developer prevents them from being an tures an extremely large $\Delta\theta_{receding}$. Of the four class A polymers in Table IV, CHiPrHFAMA/BisHFACHMA (70:30) copolymer of example 58 has the highest level of fluorination. Increasing the levels of fluorination in the class A polymer is expected to further increase surface enrichment.

Examples 64-67 use only a small amount of the more expensive (due to the more exotic fluorinated monomers) class A material in the mixture. This offers the benefit of a lower overall material cost for the topcoat system. However, the surface enrichment of the class A materials is not sufficient to overcome the overwhelming class B polymer content in the film and only modest enhancement of contact angle is seen in the best case (example 65).

TABLE IV

| Example | Class A | Class B | Ratio (A:B) | $\theta_{static}$ [°] | $\theta_{advancing}$ [°] | $\theta_{receding}$ [°] | $\theta_{tilt}$ [°] | $\Delta\theta_{receding}$ [°] |
|---|---|---|---|---|---|---|---|---|
| 9 | CHiPrHFAMA | — | — | 95.9 | 92.7 | 78.7 | 14.4 | |
| 11 | CHiPrHFAMA/STAR (80:20) | — | — | 91.8 | 91.2 | 73.5 | 15.4 | — |
| 12 | CHiPrHFAMA/STAR (70:30) | — | — | 90.3 | 90.7 | 71.3 | 17.6 | — |
| 15 | CHiPrHFAMA/ BisHFACHMA (70:30) | — | — | 83.3 | 86.9 | 70.6 | 14.9 | — |
| 31 | — | STAR/SEMA/IBOMA (75:5:20) | — | 69.2 | 82.9 | 34.3 | 44.2 | — |
| 59 | CHiPrHFAMA | STAR/SEMA/IBOMA (75:5:20) | 50:50 | 78.4 | 87.3 | 52.2 | 32.6 | −4.3 |
| 60 | CHiPrHFAMA/ BisHFACHMA (70:30) | STAR/SEMA/IBOMA (75:5:20) | 50:50 | 82.9 | 86.9 | 65.6 | 19.6 | +13.2 |
| 61 | CHiPrHFAMA/STAR (80:20) | STAR/SEMA/IBOMA (75:5:20) | 50:50 | 83.3 | 89.2 | 58.6 | 28.4 | +4.7 |
| 62 | CHiPrHFAMA/STAR (70:30) | STAR/SEMA/IBOMA (75:5:20) | 50:50 | 83.0 | 89.1 | 57.6 | 28.3 | +4.8 |
| 63 | CHiPrHFAMA/STAR (70:30) | STAR/SEMA/IBOMA (75:5:20) | 50:50 | 81.9 | 89.6 | 58.2 | 28.4 | +5.4 |
| 64 | CHiPrHFAMA | STAR/SEMA/IBOMA (75:5:20) | 10:90 | 72.1 | 84.3 | 37.7 | 42.8 | −1.0 |
| 65 | CHiPrHFAMA/ BisHFACHMA (70:30) | STAR/SEMA/IBOMA (75:5:20) | 10:90 | 74.5 | 86.9 | 44.9 | 39.0 | +7.0 |
| 66 | CHiPrHFAMA/STAR (80:20) | STAR/SEMA/IBOMA (75:5:20) | 10:90 | 71.6 | 85.1 | 37.7 | 43.1 | −0.5 |
| 67 | CHiPrHFAMA/STAR (70:30) | STAR/SEMA/IBOMA (75:5:20) | 10:90 | 73.4 | 85.5 | 39.2 | 43.4 | +1.2 |

Dissolution rates in nm/s for examples 59, 60, 61, 62, 63, 64, 65, 66 and 67 are respectively, 175, 350, 20, 300, 300, 1675, 1975, 1840 and 2250.
Examples 59 through 67 measured on $SiO_2$ except 63 on photoresist (JSR AR1682J).

To achieve greater polymer concentration gradients, the amount of fluorinated mers in the class B polymer was reduced further (from 75 mer % to 67.5 mer %) and the amount of sulfonic acid-containing mer units was reduced (from 5 mer % to 2.5 mer This also slightly reduces the amount of polar, hydrogen bonding groups capable of slowing increased polymer concentration gradients. More significantly, it is found that analogs of iPrHFAMA with substituents with less carbon than cyclohexyl are capable of similarly high receding contact angles. However, these materials have significantly greater rates of dissolution in aqueous TMAH developer. Using monomers with substituents like ethyl, isopropyl, or t-butyl, less of the dissolution-enhancing (but contact angle lowering) STAR monomer was required to obtain copolymers with similar receding contact angles to CHiPrHFAMA/STAR. In fact, EtiPrHFAMA (example 4) has both higher receding contact angle and higher dissolution rate than iPrHFAMA/HFIPMA (80:20) (example 3).

Table V lists topcoat blends with high fluorine content class A polymers and low fluorine content class B polymers. Table V lists the properties of class A iPriPrHFAMA/STAR copolymers with class B STAR/SEMA/IBOMA (67.5:2.5:30) terpolymers. All these topcoat materials exhibit extremely strong surface enrichment of the iPriPrHFAMA/STAR as indicated by the large $\Delta\theta_{receding}$ values. Similar results are obtained when casting on bare silicon (examples 68-69) and on resist (JSR AR1682J) (examples 72-73). Asymmetric blends (examples 70-71) show slightly lower receding contact angles, although the small amount of class A polymer seems even more effective in raising contact angles in the resulting film (larger $\Delta\theta_{receding}$ values). Examples 74-77 have topcoat thicknesses between about 30 nm and about 120 nm.

TABLE V

| Example | Class A | Class B | Ratio (A:B) | $\theta_{static}$ [°] | $\theta_{advancing}$ [°] | $\theta_{receding}$ [°] | $\theta_{tilt}$ [°] | $\Delta\theta_{receding}$ [°] |
|---|---|---|---|---|---|---|---|---|
| 6 | iPriPrHFAMA/STAR (90:10) | — | — | 90.7 | 92.2 | 74.7 | 15.5 | — |
| 7 | iPriPrHFAMA/STAR (80:20) | — | — | 89.6 | 92.1 | 72.9 | 18.0 | — |
| 33 | — | STAR/SEMA/IBOMA (67.5:2.5:30) | — | 73.0 | 83.4 | 42.1 | 37.9 | — |
| 68 | iPriPrHFAMA/STAR (90:10) | STAR/SEMA/IBOMA (67.5:2.5:30) | 50:50 | 91.6 | 92.7 | 72.9 | 17.8 | +14.5 |
| 69 | iPriPrHFAMA/STAR (80:20) | STAR/SEMA/IBOMA (67.5:2.5:30) | 50:50 | 90.6 | 92.2 | 71.9 | 18.8 | +14.4 |
| 70 | iPriPrHFAMA/STAR (90:10) | STAR/SEMA/IBOMA (67.5:2.5:30) | 10:90 | 87.3 | 91.6 | 65.7 | 23.6 | +20.3 |

TABLE V-continued

| Example | Class A | Class B | Ratio (A:B) | $\theta_{static}$ [°] | $\theta_{advancing}$ [°] | $\theta_{receding}$ [°] | $\theta_{tilt}$ [°] | $\Delta\theta_{receding}$ [°] |
|---|---|---|---|---|---|---|---|---|
| 71 | iPriPrHFAMA/STAR (80:20) | STAR/SEMA/IBOMA (67.5:2.5:30) | 10:90 | 85.0 | 91.1 | 63.9 | 24.4 | +18.7 |
| 72 | iPriPrHFAMA/STAR (90:10) | STAR/SEMA/IBOMA (67.5:2.5:30) | 50:50 | 91.5 | 92.5 | 72.4 | 18.7 | +14.0 |
| 73 | iPriPrHFAMA/STAR (80:20) | STAR/SEMA/IBOMA (67.5:2.5:30) | 50:50 | 89.8 | 91.9 | 70.2 | 19.5 | +12.7 |
| 74* | iPriPrHFAMA/STAR (90:10) | STAR/SEMA/IBOMA (67.5:2.5:30) | 50:50 | 91.5 | 92.4 | 72.1 | 18.1 | +13.7 |
| 75* | iPriPrHFAMA/STAR (80:20) | STAR/SEMA/IBOMA (67.5:2.5:30) | 50:50 | 90.6 | 91.8 | 70.2 | 19.1 | +12.7 |
| 76* | iPriPrHFAMA/STAR (90:10) | STAR/SEMA/IBOMA (67.5:2.5:30) | 10:90 | 85.4 | 91.4 | 63.0 | 25.0 | +17.6 |
| 77* | iPriPrHFAMA/STAR (80:20) | STAR/SEMA/IBOMA (67.5:2.5:30) | 10:90 | 84.9 | 90.9 | 62.3 | 26.1 | +17.1 |

Dissolution rates in nm/s for examples 68, 69, 70, 71, 72 and 73 are respectively, 95, 160, 500, 495, 95 and 160.
Examples 68 through 70 measured on SiO$_2$, examples 71 through 77 measured on photoresist (JSR AR1682J).

Other examples of graded topcoats using different class A polymers are listed in Table VI. The iPrHFAMA-based class A polymers are especially advantageous given the wide commercial availability of the iPrHFAMA monomer.

TABLE VI

| Example | Class A | Class B | Ratio (A:B) | $\theta_{static}$ [°] | $\theta_{advancing}$ [°] | $\theta_{receding}$ [°] | $\theta_{tilt}$ [°] | $\Delta\theta_{receding}$ [°] |
|---|---|---|---|---|---|---|---|---|
| 1 | iPrHFAMA | — | — | 82.9 | 87.2 | 65.6 | 20.5 | — |
| 3 | iPrHFAMA:HFIPMA (80:20) | — | — | 87.9 | 89.1 | 69.4 | 17.8 | — |
| 4 | EtiPrHFAMA | — | — | 88.2 | 90.1 | 71.9 | 16.0 | — |
| 33 | — | STAR/SEMA/IBOMA (67.5:2.5:30) | — | 73.0 | 83.4 | 42.1 | 37.9 | — |
| 34 | — | STAR/SEMA/IBOMA (57.5:2.5:40) | — | 73.9 | 83.6 | 44.0 | 36.2 | — |
| 78 | iPrHFAMA | STAR/SEMA/IBOMA (67.5:2.5:30) | 50:50 | 82.1 | 86.0 | 64.1 | 19.6 | +10.3 |
| 79 | iPrHFAMA | STAR/SEMA/IBOMA (67.5:2.5:30) | 75:25 | 82.7 | 85.2 | 65.9 | 17.6 | +5.9 |
| 80 | iPrHFAMA:HFIPMA (80:20) | STAR/SEMA/IBOMA (67.5:2.5:30) | 50:50 | 88.1 | 89.1 | 67.1 | 20.2 | +11.4 |
| 81 | EtiPrHFAMA | STAR/SEMA/IBOMA (67.5:2.5:30) | 50:50 | 88.8 | 90.1 | 72.3 | 15.8 | +15.3 |
| 82 | iPrHFAMA | STAR/SEMA/IBOMA (57.5:2.5:40) | 50:50 | 82.1 | 85.4 | 64.2 | 19.7 | +9.4 |

Dissolution rates in nm/s for examples 78, 79, 80, 81 and 82 are respectively, 480, 275, 120, 170 and 200.
Examples 79 and 80 measured on SiO$_2$, examples 78, 81 and 82 measured on photoresist (JSR AR1682J).

The graded film composition of two topcoats (examples 69 and 78) cast on top of resist (JSR AR1682J) are elucidated by secondary ion mass spectroscopy (SIMS) and angle-rotated x-ray photoelectron spectroscopy (XPS). In both systems, a clear enrichment (high sulfonic acid, low fluorine) layer of the class B polymer at the resist interface is seen by SIMS. Angle-rotated x-ray photoelectron spectroscopy was used to probe the surface (top 5 nm) composition of the same two graded topcoats. XPS shows that both topcoats have a distinct surface-enrichment layer of the more fluorinated class A polymer that is several nanometers thick. The extent of enrichment calculated from the average of the various elemental signatures as a function of depth for these two materials is shown in Table VII. Both materials show that the surface composition is roughly 80% of the class A polymer. This is not far below that suggested by the water contact angles.

TABLE VII

| Example | Material | Angle [°] | CH | CF | $N_{1s}$ | $O_{1s}$ | $F_{1s}$ | $S_{metal}$ | $S_{oxide}$ | % Class A |
|---|---|---|---|---|---|---|---|---|---|---|
| 1 | iPrHFAMA | 10 | 39.9 | 8.5 | 0.0 | 15.6 | 36.0 | 0.0 | 0.0 | 100 |
|  | (2.5 nm) | 45 | 43.8 | 8.4 | 0.0 | 16.0 | 31.9 | 0.0 | 0.0 | 100 |
|  | (5.0 nm) |  |  |  |  |  |  |  |  |  |
| 7 | iPriPrHFAMA/STAR | 10 | 42.9 | 7.1 | 1.1 | 15.4 | 32.5 | 0.1 | 0.9 | 100 |
|  | (80:20) | 45 | 45.0 | 6.6 | 1.3 | 16.3 | 29.9 | 0.2 | 0.9 | 100 |
| 33 | STAR/SEMA/IBOMA | 10 | 50.4 | 3.4 | 4.7 | 20.7 | 16.1 | 0.1 | 4.6 | — |
|  | (67.5:2.5:30) | 45 | 53.1 | 2.7 | 4.6 | 21.7 | 13.8 | 0.1 | 4.0 | — |
| 69 | iPriPrHFAMA/STAR & | 10 | 46.1 | 6.7 | 1.7 | 16.1 | 27.7 | 0.2 | 1.7 | 81.3 |
|  | STAR/SEMA/IBOMA | 45 | 50.5 | 5.1 | 2.6 | 17.2 | 22.5 | 0.2 | 1.9 | 67.3 |
| 78 | iPrHFAMA & | 10 | 42.4 | 7.6 | 1.1 | 16.0 | 31.8 | 0.2 | 0.9 | 77.9 |
|  | STAR/SEMA/IBOMA | 45 | 47.6 | 6.4 | 1.7 | 17.0 | 25.9 | 0.1 | 1.3 | 59.8 |

CH, CF, $N_{1s}$, $O_{1s}$, $F_{1s}$, $S_{metal}$ and $S_{oxide}$ are atomic percent. CF are fluorinated carbons (i.e., $CF_3$), CH are all other carbons.

It is advantageous to remove fluorine from the class B polymer entirely, from both a cost (fluorinated monomers are generally more expensive) as well as a phase-separation (fluorinated groups are low surface energy substituents) perspective. Fluorine-free class B polymers were developed by replacing trifluoromethyl sulfonamide-containing methacrylate with methacrylic acid. However, exceeding large amounts of methacrylic acid are required (>50%) before the MAA/SEMA/IBOMA copolymer dissolves without swelling (examples 39-42). Replacing the hydrophobic IBOMA monomer with the more hydrophilic methyl methacrylate allowed modest incorporation of methyl methacrylate to afford fluorine-free class B polymers with linear dissolution in aqueous TMAH developer. Blends with some of non-fluorine containing class A polymers are shown in TABLE VII. These materials exhibited higher contact angles when cast on silicon than on photoresist (examples 83-86). This is likely due to the closer match between the surface energy of the very hydrophilic class B polymer and bare silicon than with the more hydrophobic photoresist. These materials offer slightly lower receding contact angles than those outlined in Table V and table VI.

Figure 3:
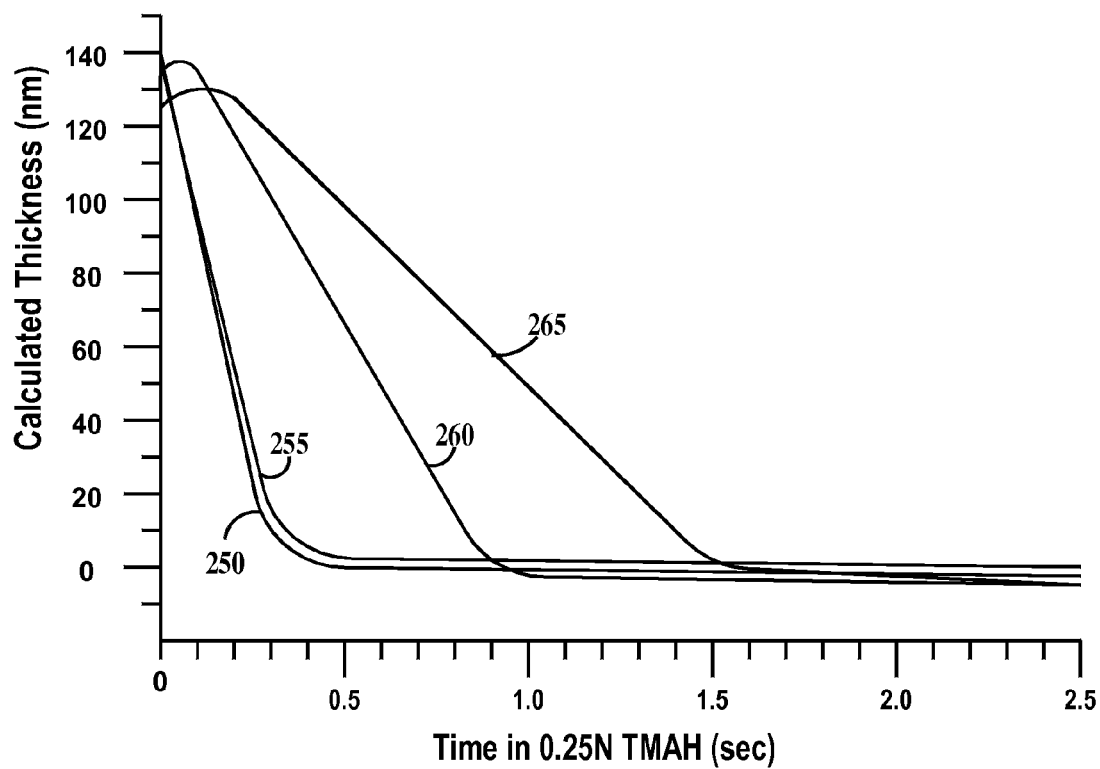
FIG. 3 is a dissolution plot of exemplary topcoat mixtures.

FIG. 3 is a dissolution plot of exemplary topcoat mixtures. Dissolution rates of examples 68 (curve 250), 71 (curve 255), 69 (curve 260) and 68 (curve 265) as measured by a quartz crystal microbalance are illustrated. All four samples show a linear dissolution rate with no swelling, minimal dissolution lag, and no scumming.

Figure 4:
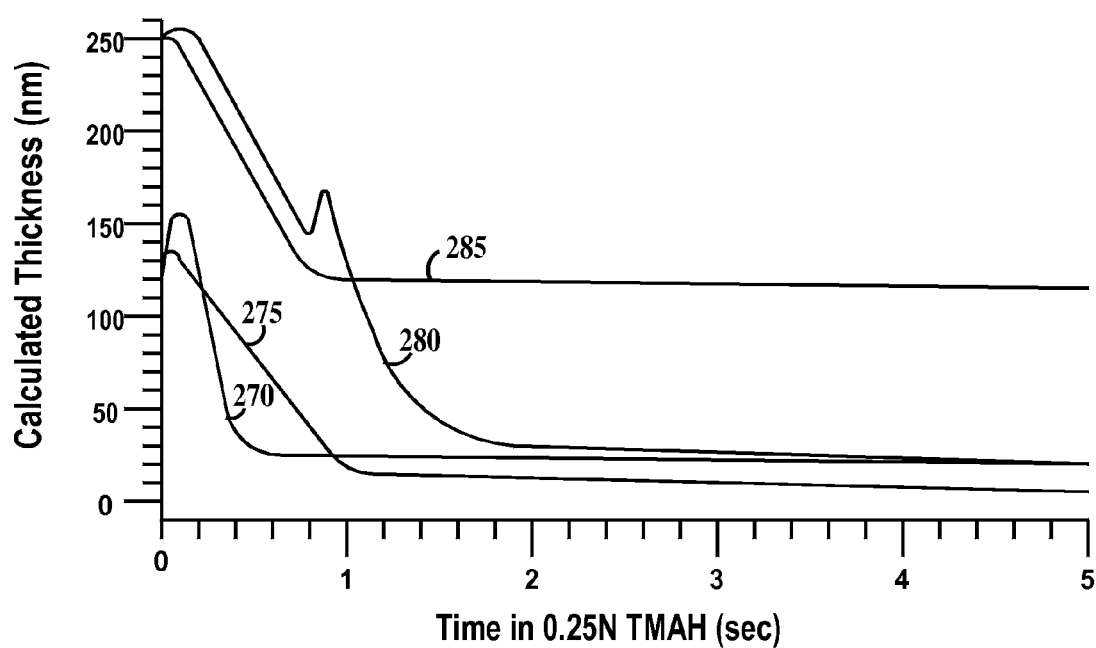
FIG. 4 is a dissolution plot of exemplary topcoat mixtures on a photoresist layer.

FIG. 4 is a dissolution plot of exemplary topcoat mixtures on a photoresist layer. Curve 270 is exposed photoresist, curve 275 is example 69, curve 280 is example 73 exposed and curve 285 is example 73 unexposed. The dissolution behavior of the topcoat mixtures are unaffected when cast on photoresist. Just like the contact angles, the dissolution rate is unaffected by the substrate and exposure. The slight swelling peak (characteristic of the photoresist) is unchanged when the graded topcoat is present. This indicates that minimal inter-diffusion between the topcoat and resist has occurred.

Figure 5:
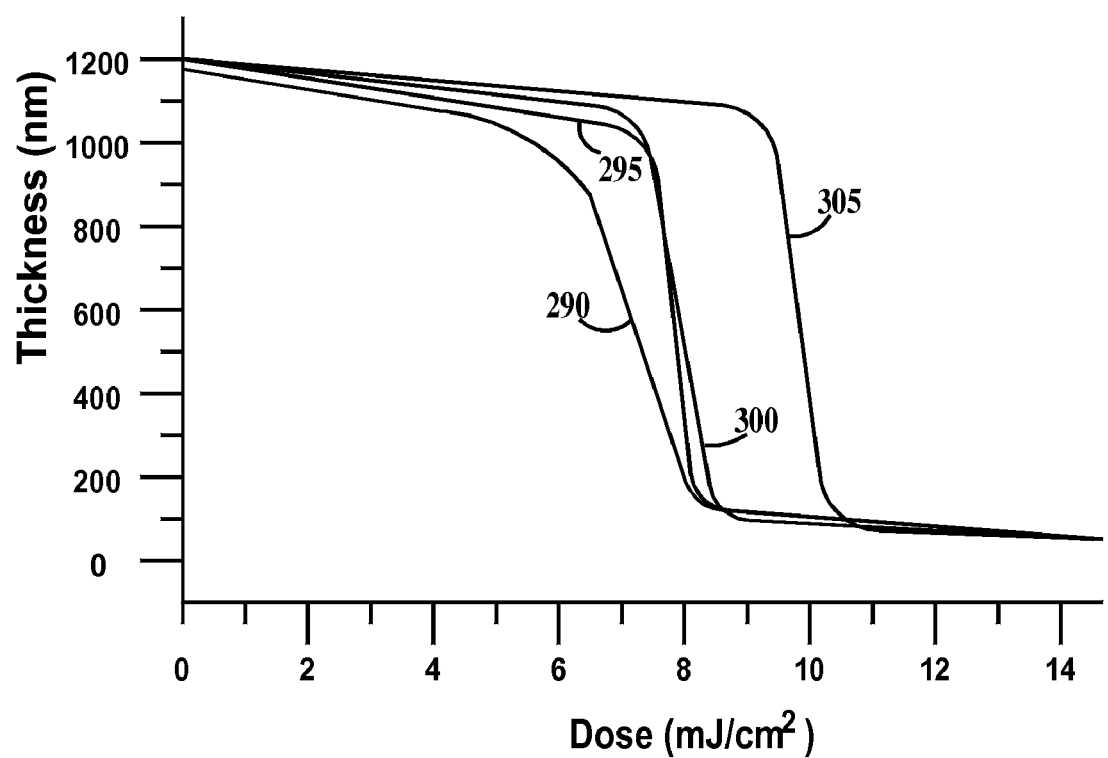
FIG. 5 is a contrast plot of exemplary topcoat mixtures on a photoresist layer.

FIG. 5 is a contrast plot of exemplary topcoat mixtures on a photoresist layer. The effects of the graded topcoat and its individual component polymers on the contrast curve of the resist (JSR AR1682J) are shown in FIG. 5. Curve 290 is photoresist, curve 295 is photoresist coated with example 33, curve 300 is photoresist coated with example 73 and curve 305 is photoresist coated with example 7. While water contact angles indicate the class A polymer has segregated to the air interface, which polymer has segregated to the resist interface can be probed by examination of the contrast curve. When a class A polymer is cast onto the photoresist resist, the dose required to fully expose the photoresist resist is increased considerably. However, with the graded topcoat, the dose required to expose the photoresist is about the same as when a topcoat comprising only class B polymer is used. This indicates that the class B polymer has segregated to the resist interface.

It is advantageous for topcoat mixtures to have $\Delta\theta_{receding}$ equal to or greater than about 9°. In some examples it is found that the weighted average (weighted by the ratio A:B) of the $\theta_{receding}$ of the class A and class B polymers of a given topcoat blend is less than the $\theta_{receding}$ of the topcoat blend itself as illustrated in Table X. It should also be noted that the $\theta_{receding}$ of the class A polymer is greater than the $\theta_{receding}$ of the class B polymer in any given topcoat blend.

TABLE VIII

| Example | Class A | Class B | Ratio (A:B) | $\theta_{static}$ [°] | $\theta_{advancing}$ [°] | $\theta_{receding}$ [°] | $\theta_{tilt}$ [°] | $\Delta\theta_{receding}$ [°] |
|---|---|---|---|---|---|---|---|---|
| 7 | iPriPrHFAMA/STAR (80:20) | — | — | 89.6 | 92.1 | 72.9 | 18.0 | — |
| 3 | iPrHFAMA:HFIPMA (80:20) | — | — | 87.9 | 89.1 | 69.4 | 17.8 | — |
| 44 | — | MAA/SEMA/MMA (40:2.5:57.5) | — | 50.9 | 68.1 | 12.4 | 45.9 | — |
| 46 | — | MAA/SEMA/MMA (20:2.5:77.5) | — | 54.1 | 72.2 | 20.7 | 45.4 | — |
| 83 | iPriPrHFAMA/STAR (80:20) | MAA/SEMA/MMA (40:2.5:57.5) | 50:50 | 88.9 | 92.0 | 65.6 | 24.6 | +22.9 |
| 84 | iPrHFAMA:HFIPMA (80:20) | MAA/SEMA/MMA (40:2.5:57.5) | 50:50 | 85.8 | 90.0 | 60.8 | 28.7 | +19.9 |
| 85 | iPriPrHFAMA/STAR (80:20) | MAA/SEMA/MMA (40:2.5:57.5) | 50:50 | 85.6 | 91.3 | 57.9 | 32.3 | +15.2 |
| 86 | iPrHFAMA:HFIPMA (80:20) | MAA/SEMA/MMA (40:2.5:57.5) | 50:50 | 82.7 | 89.1 | 54.5 | 34.5 | +13.6 |
| 87 | iPriPrHFAMA/STAR (80:20) | MAA/SEMA/MMA (20:2.5:77.5) | 50:50 | 86.3 | 91.4 | 61.5 | 30.1 | +14.7 |
| 88 | iPrHFAMA:HFIPMA (80:20) | MAA/SEMA/MMA (20:2.5:77.5) | 50:50 | 83.7 | 90.1 | 59.2 | 30.3 | +14.2 |

Dissolution rates in nm/s for examples 83, 84, 85, 86, 87 and 88 are respectively, 1280, 1920, 1280, 1920, 220 and 120.
Examples 83 and 84 on $SiO_2$, examples 85-88 on photoresist (JSR AR1682J).

A true test of the ability of a topcoat is its ability to prevent leaching of photoacid generator (PAG) into water. The normalized measurements of PAG leaching for the various graded topcoat materials on JSR AR1682J resist are shown in Table IX. All of the graded topcoats show that greater than 97% of the baseline (resist without topcoat) extraction has been prevented by the graded topcoat.

TABLE IX

| Sample | Normalized PAG extraction |
|---|---|
| AR1682J (no topcoat) | 100 |
| Example 72 | 2.58 |
| Example 73 | 1.40 |
| Example 78 | 1.24 |
| Example 81 | 0.62 |
| Example 87 | 0.36 |

TABLE X

| TOPCOAT EXAMPLE | Class A $\theta_{receding}$ [°] | Class B $\theta_{receding}$ [°] | A:B RATIO | WEIGHT AVERAGE $\theta_{receding}$ [°] | TOPCOAT $\theta_{receding}$ [°] | $\Delta \theta_{receding}$ [°] |
|---|---|---|---|---|---|---|
| 60 | 70.6 | 34.3 | 50:50 | 52.5 | 65.6 | 13.2 |
| 68 | 74.7 | 42.1 | 50:50 | 58.4 | 72.9 | 14.5 |
| 69 | 72.9 | 42.1 | 50:50 | 57.5 | 71.9 | 14.4 |
| 70 | 74.7 | 42.1 | 10:90 | 45.4 | 65.7 | 20.3 |
| 71 | 72.9 | 42.1 | 10:90 | 45.2 | 63.9 | 18.7 |
| 72 | 74.7 | 42.1 | 50:50 | 58.4 | 72.4 | 14.0 |
| 73 | 72.9 | 42.1 | 50:50 | 57.5 | 70.2 | 12.7 |
| 74 | 74.7 | 42.1 | 50:50 | 58.4 | 72.1 | 13.7 |
| 75 | 72.9 | 42.1 | 50:50 | 57.5 | 70.2 | 12.7 |
| 76 | 74.7 | 42.1 | 10:90 | 43.4 | 63.0 | 17.6 |
| 77 | 72.9 | 42.1 | 10:90 | 45.2 | 62.3 | 17.1 |
| 80 | 74.7 | 42.1 | 50:50 | 58.4 | 67.1 | 8.7 |
| 81 | 66.9 | 42.1 | 50:50 | 54.5 | 72.3 | 18.8 |
| 82 | 65.6 | 44.0 | 50:50 | 54.8 | 64.2 | 9.4 |

The graded film structure in the present invention is ideal for controlling reflectivity as well if the refractive indices of the class A and class B polymers are tailored appropriately. For example, a class A polymer with a refractive index similar to that of the immersion fluid and a class B polymer with a refractive index similar to the photoresist would help minimize reflection at the immersion fluid/topcoat interface and the topcoat/photoresist interface, respectively. In addition, the ratios of the two polymers and the overall film thickness can be optimized to provide a graded immersion topcoat with anti-reflective properties. The optical properties of several class A and class B polymers are shown in Table XI. In these examples, the refractive indices (n) of the class A polymers (examples 1, 3 and 7) are close to that of the immersion fluid (water, n=1.435 at 193 nm) and the class B polymers (examples 33 and 46) are close to that of 193 nm photoresists (typically n=1.6-1.7).

TABLE XI

| Example | Polymer | n (193 nm) | k (193 nm) | $\alpha_{10}$ (193 nm) [μm$^{-1}$] |
|---|---|---|---|---|
| 1 | iPriPrHFAMA | 1.522 | 0.00439 | 0.1241 |
| 3 | iPrHFAMA:HFIPMA (80:20) | 1.511 | 0.00411 | 0.1162 |
| 7 | iPriPrHFAMA/STAR (80:20) | 1.548 | 0.00531 | 0.1501 |
| 33 | STAR/SEMA/IBOMA (67.5:2.5:30) | 1.626 | 0.00914 | 0.2585 |
| 46 | MAA/SEMA/MMA (20:2.5:77.5) | 1.661 | 0.00763 | 0.2156 |

The topcoat compositions of the present invention may be used with other classes of immersion lithography tools, an example of which is an immersion lithography tool wherein the immersion fluid is dispensed onto the wafer from openings in the lens barrel surrounding the lens.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming an image in a photoresist layer, comprising:
   (a) forming said photoresist layer over a substrate;
   (b) forming a topcoat layer on a top surface of said photoresist layer, said topcoat layer comprising a first polymer and a second polymer, said second polymer different from said first polymer, said second polymer miscible with said first polymer, said first and second polymers of said topcoat layer dispersing non-homogenously in a vertical direction perpendicular to said top surface of said photoresist layer;
   (c) forming a layer of immersion fluid between said topcoat layer and a final lens element or window of an immersion lithography system;
   (d) exposing said photoresist to radiation through a photomask having opaque and clear regions, said opaque regions blocking said radiation and said clear regions being transparent to said radiation, said radiation changing the chemical composition of regions of said photoresist layer exposed to said radiation, forming exposed and unexposed regions in said photoresist layer; and
   (e) removing either said exposed regions of said photoresist layer or said unexposed regions of said photoresist layer.

2. The method of claim 1:
   wherein after step (b) and before step (d) said first polymer has a first molar concentration at a top surface of said topcoat layer that is greater than a second molar concentration of said first polymer at a bottom surface of said topcoat layer, said bottom surface of said topcoat layer in direct physical contact with said top surface of said photoresist layer.

3. The method of claim 1:
   wherein after step (b) and before step (d) said second polymer has a first molar concentration at a top surface of said topcoat layer that is less than a second molar concentration of said second polymer at a bottom surface of said topcoat layer, said bottom surface of said topcoat layer in direct physical contact with said top surface of said photoresist layer.

4. The method of claim 1, wherein after step (b) and before step (d):
   said first polymer has a first molar concentration at a top surface of said topcoat layer that is greater than a first molar concentration of said second polymer at said top surface of said topcoat layer;

said first polymer has a second molar concentration at a bottom surface of said topcoat layer that is less than a second molar concentration of said second polymer at said bottom surface of said topcoat layer; and said bottom surface of said topcoat layer in direct physical contact with said top surface of said photoresist layer.

5. The method of claim 1, further including, prior to (a), forming an anti-reflective coating over a top surface of said substrate, wherein said photoresist layer is formed on a top surface of said anti-reflective coating.

6. The method of claim 1, wherein said immersion fluid is selected from the group consisting of water, water with soluble chemical additives, a hydrocarbon fluid, a water based nano-particle dispersion, and a hydrocarbon based nano-particle dispersion.

7. The method of claim 1, further including removing said topcoat layer.

8. The method of claim 1, further including, between (b) and (c), removing a casting solvent from said topcoat layer.

9. The method of claim 1, further including, between steps (d) and (e), heating said photoresist layer to a temperature above room temperature.

10. The method of claim 1, wherein said first polymer comprises one or more different monomers selected from the group consisting of:

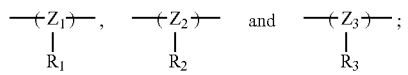

wherein each $Z_1$, $Z_2$, and $Z_3$ is independently selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, carbonate groups, acetal groups, ketal groups, siloxyl groups, carboxylic acid groups, carboxylic acid anhydride groups, carboxylic acid anhydride half-ester groups, ether groups, amide groups, carbamate groups, thioether groups, fluorinated linear alkylenes, fluorinated branched alkylenes, fluorinated cyclic alkylenes, polycyclic alkylenes, fluorinated linear heteroalkylenes, fluorinated branched heteroalkylenes, fluorinated cyclic heteroalkylenes, fluorinated polycyclic heteroalkylenes, fluorinated ester groups, fluorinated carbonyl groups, fluorinated carbonate groups, fluorinated acetal groups, fluorinated ketal groups, fluorinated siloxyl groups, fluorinated carboxylic acid groups, fluorinated carboxylic acid anhydride groups, fluorinated carboxylic acid anhydride half-ester groups, fluorinated ether groups, fluorinated amide groups, fluorinated carbamate groups, and fluorinated thioether groups;

wherein $R_1$ is selected from the group consisting of a fluoroalcohol group, a fluoroalcohol group protected with an acid-labile group, a fluoroalcohol group protected with a base-labile group, a fluoroalcohol group protected with an acid-labile fluorinated group, a fluoroalcohol group protected with a base-labile fluorinated group, and an —$X_1$—$Y_1$ group wherein $X_1$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups and ketal groups and $Y_1$ is selected from the group consisting of a fluoroalcohol group, a fluoroalcohol group protected with an acid-labile group, a fluoroalcohol group protected with a base-labile group, a fluoroalcohol group protected with an acid-labile fluorinated group and a fluoroalcohol group protected with a base-labile fluorinated group;

wherein $R_2$ is selected from the group consisting of hydrogen, fluorine, a fluoroalcohol group, a sulfonamide group, a phenolic group, a naphtholic group, a carboxylic acid group and a sulfonic acid group and an —$X_2$—$Y_2$ group wherein $X_2$ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups amide groups, ether groups, thioether groups, carbonate groups, carbamate groups, acetal groups and ketal groups and $Y_2$ is selected from the group consisting of a fluoroalcohol group, a sulfonamide group, a phenolic group, a naphtholic group, a carboxylic acid group and a sulfonic acid group;

wherein $R_3$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes and an —$X_3$—$Y_3$ group wherein $X_3$ is selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, amide groups, ether groups, thioether groups, carbonate groups, carbamate groups, acetal groups and ketal groups and $Y_3$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes and fluorinated polycylic heteroalkanes.

11. The method of claim 1, wherein said first polymer is selected from the group consisting of:

(a) a polymer comprising:

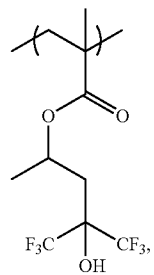

(b) a polymer comprising Y mer % of

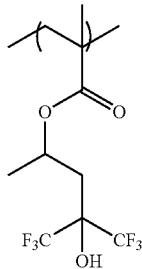 and Z mer % of 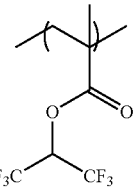

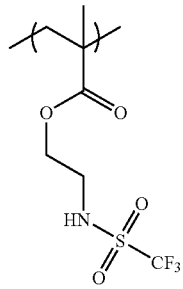

wherein Y=any number from 0 to 100 and Z=any number from 0 to 100 such that Y+Z is greater than or equal to 50 and less than or equal to 100, c) a polymer comprising

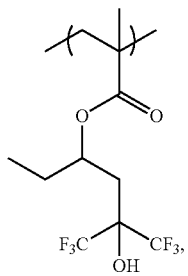

(d) a polymer comprising:

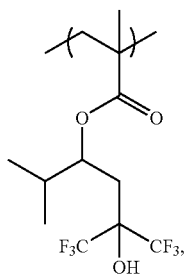

(e) a polymer comprising Y mer % of

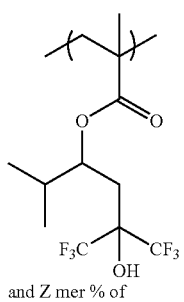

and Z mer % of

-continued

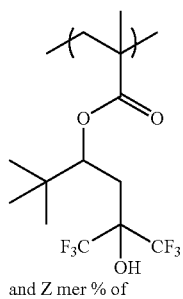

wherein Y=any number from 0 to 100 and Z=any number from 0 to 100 such that Y+Z is greater than or equal to 50 and less than or equal to 100, (f) a polymer comprising Y mer % of

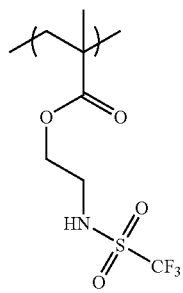

and Z mer % of

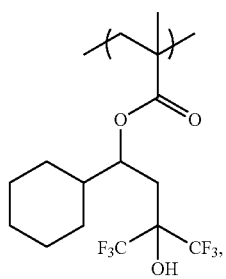

wherein Y=any number from 0 to 100 and Z=any number from 0 to 100 such that Y+Z is greater than or equal to 50 and less than or equal to 100, (g) a polymer comprising:

(h) a polymer comprising Y mer % of

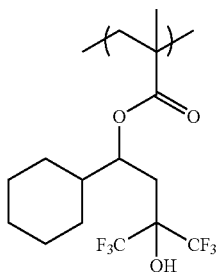

and Z mer % of

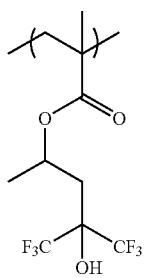

wherein Y=any number from 0 to 100 and Z=any number from 0 to 100 such that Y+Z is greater than or equal to 50 and less than or equal to 100, (i) a polymer comprising Y mer % of

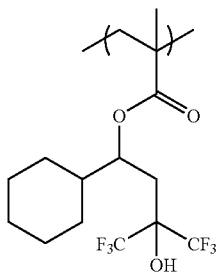

and Z mer % of

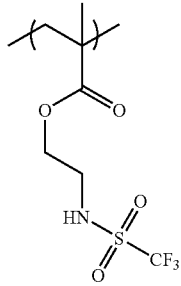

wherein Y=any number from 0 to 100 and Z=any number from 0 to 100 such that Y+Z is greater than or equal to 50 and less than or equal to 100, (j) a polymer comprising Y mer % of

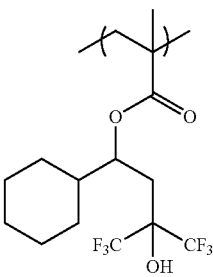

and Z mer % of

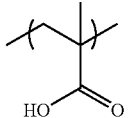

wherein Y=any number from 0 to 100 and Z=any number from 0 to 100 such that Y+Z is greater than or equal to 50 and less than or equal to 100, (k) a polymer comprising Y mer % of

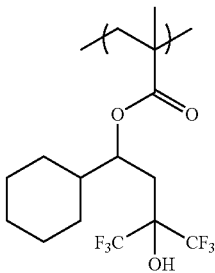

and Z mer % of

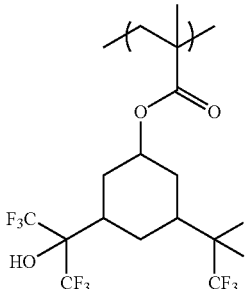

wherein Y=any number from 0 to 100 and Z=any number from 0 to 100 such that Y+Z is greater than or equal to 50 and less than or equal to 100, (l) a polymer comprising Y mer % of

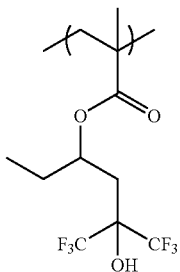

and Z mer % of
-continued

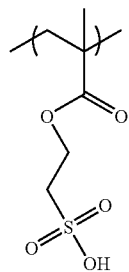

wherein Y=any number from 0 to 99.9 and Z=any number from 0.1 to 100 such that Y+Z is greater than or equal to 50 and less than or equal to 100, and (m) a polymer comprising W mer % of

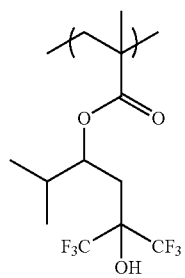

and Y mer % of

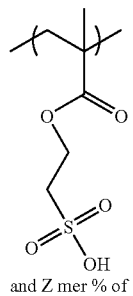

and Z mer % of

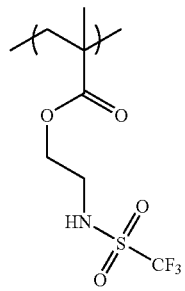

wherein W=any number from 0 to 99.9, Y=any number from 0.1 to 99.9, Z=any number from 0 to 99.9 such that W+Y+Z is greater than or equal to 50 and less than or equal to 100.

12. The method of claim 1, wherein said second polymer comprises one or more different monomers selected from the group consisting of:

$$-(Z_4)-\quad -(Z_5)-\quad -(Z_6)- \\ \phantom{-(Z}|\phantom{)-}\qquad \phantom{-(Z}|\phantom{)-}\quad \text{and}\quad \phantom{-(Z}|\phantom{)-}\,; \\ \phantom{-(}R_4\phantom{)-}\qquad \phantom{-(}R_5\phantom{)-}\qquad \phantom{-(}R_6\phantom{)-}$$

wherein each $Z_4$, $Z_5$, and $Z_6$ is independently selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, carbonate groups, acetal groups, ketal groups, siloxyl groups, carboxylic acid groups, carboxylic acid anhydride groups, carboxylic acid anhydride half-ester groups, ether groups, amide groups, carbamate groups, thioether groups, fluorinated linear alkylenes, fluorinated branched alkylenes, fluorinated cyclic alkylenes, polycyclic alkylenes, fluorinated linear heteroalkylenes, fluorinated branched heteroalkylenes, fluorinated cyclic heteroalkylenes, fluorinated polycyclic heteroalkylenes, fluorinated ester groups, fluorinated carbonyl groups, fluorinated carbonate groups, fluorinated acetal groups, fluorinated ketal groups, fluorinated siloxyl groups, fluorinated carboxylic acid groups, fluorinated carboxylic acid anhydride groups, fluorinated carboxylic acid anhydride half-ester groups, fluorinated ether groups, fluorinated amide groups, fluorinated carbamate groups and fluorinated thioether groups;

wherein $R_4$ is selected from the group consisting of a sulfonic acid group, a sulfinic acid group, a carboxylic acid group and an $-X_4-Y_4$ group wherein $X_4$ is selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, amide groups, ether groups, thioether groups, carbonate groups, carbamate groups, acetal groups and ketal groups and $Y_4$ is selected from the group consisting of a sulfonic acid group, a sulfinic acid group and a carboxylic acid group;

wherein $R_5$ is selected from the group consisting of hydrogen, fluorine, a fluoroalcohol group, a sulfonamide group, a phenolic group, a naphtholic group, a carboxylic acid group and a sulfonic acid group and an $-X_5-Y_5$ group wherein $X_5$ is selected from the group consisting of linear alkylenes, branched alkylenes, cyclic alkylenes, polycyclic alkylenes, linear heteroalkylenes, branched heteroalkylenes, cyclic heteroalkylenes, polycyclic heteroalkylenes, ester groups, carbonyl groups, amide groups, ether groups, thioether groups, carbonate groups, carbamate groups, acetal groups and ketal groups and $Y_5$ is selected from the group consisting of a fluoroalcohol group, a sulfonamide group, a phenolic group, a naphtholic group, a carboxylic acid group and a sulfonic acid group; and wherein $R_6$ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycyclic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes, fluorinated polycylic heteroalkanes and an —X₆—Y₆ group wherein X₆ is selected from the group consisting of linear alkylenes, branched alkylenes, cyclic alkylenes, polycyclic alkylenes, linear heteroalkylenes, branched heteroalkylenes, cyclic heteroalkylenes, polycylic heteroalkylenes, ester groups, carbonyl groups, amide groups, ether groups, thioether groups, carbonate groups, carbamate groups, acetal groups and ketal groups and Y₃ is selected from the group consisting of hydrogen, fluorine, an acid-labile group, a base-labile group, an acid-labile fluorinated group, a base-labile fluorinated group, linear alkanes, branched alkanes, cyclic alkanes, polycyclic alkanes, linear heteroalkanes, branched heteroalkanes, cyclic heteroalkanes, polycylic heteroalkanes, fluorinated linear alkanes, fluorinated branched alkanes, fluorinated cyclic alkanes, fluorinated polycyclic alkanes, fluorinated linear heteroalkanes, fluorinated branched heteroalkanes, fluorinated cyclic heteroalkanes and fluorinated polycylic heteroalkanes.

13. The method of claim 1, wherein said second polymer is selected from the group consisting of:

(a) a polymer comprising Y mer % of

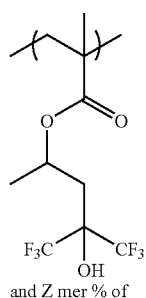

and Z mer % of

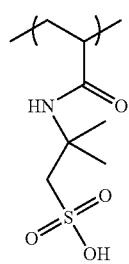

wherein Y=any number from 0 to 99.9 and Z=any number from 0.1 to 100 such that Y+Z is greater than or equal to 50 and less than or equal to 100, (b) a polymer comprising Y mer 00 of

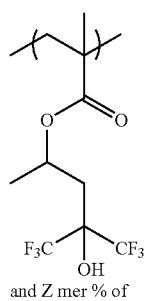

and Z mer % of

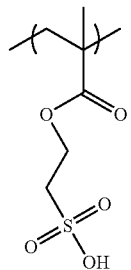

wherein Y=any number from 0 to 99.9, Z=any number from 0.1 to 100 such that Y+Z is greater than or equal to 50 and less than or equal to 100, (c) a polymer comprising W mer % of

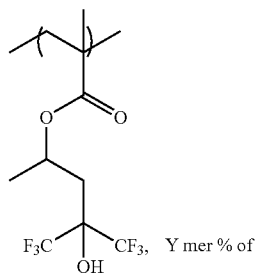

Y mer % of

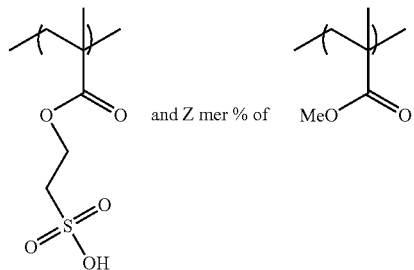

and Z mer % of wherein W=any number from 0 to 99.9, Y=any number from 0.1 to 99.9, Z=any number from 0 to 99.9 such that W+Y+Z is greater than or equal to 50 and less than or equal to 100, (d) a polymer comprising W mer % of

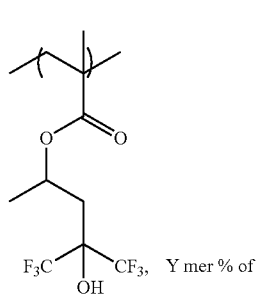

Y mer % of

-continued

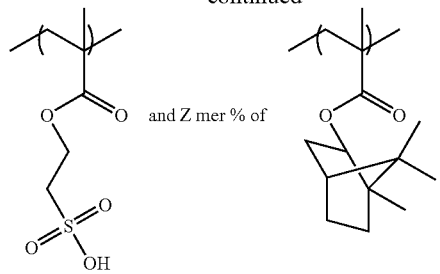 and Z mer % of wherein W=any number from 0 to 99.9, Y=any number from 0.1 to 99.9, Z=any number from 0 to 99.9 such that W+Y+Z is greater than or equal to 50 and less than or equal to 100, (e) a polymer comprising Y mer % of

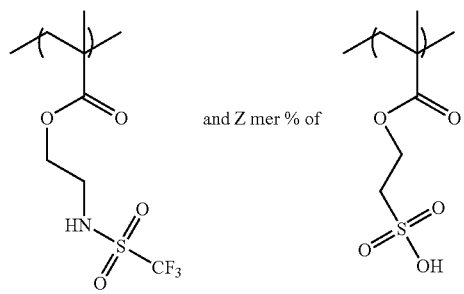 and Z mer % of wherein Y=any number from 0 to 99.9 and Z=any number from 0.1 to 100 such that Y+Z is greater than or equal to 50 and less than or equal to 100, (f) a polymer comprising W mer % of

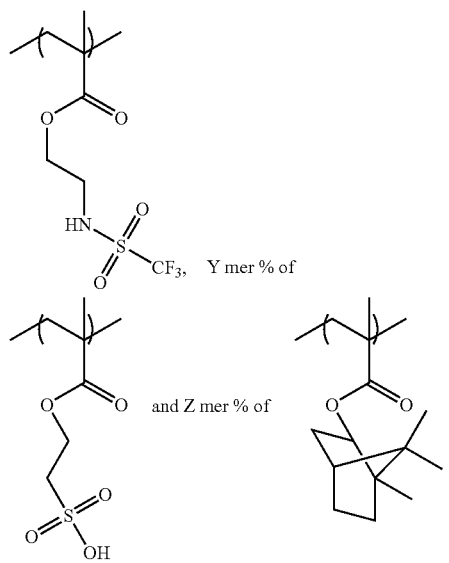 and Z mer % of wherein W=any number from 0 to 99.9, Y=any number from 0.1 to 99.9, Z=any number from 0 to 99.9 such that W+Y+Z is greater than or equal to 50 and less than or equal to 100, (g) a polymer comprising W mer % of

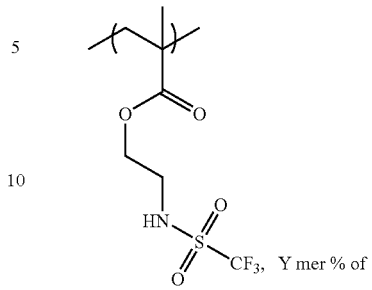 Y mer % of

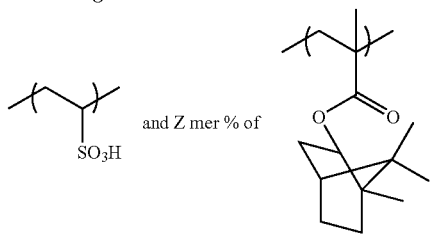 and Z mer % of wherein W=any number from 0 to 99.9, Y=any number from 0.1 to 99.9, Z=any number from 0 to 99.9 such that W+Y+Z is greater than or equal to 50 and less than or equal to 100, (h) a polymer comprising W mer % of

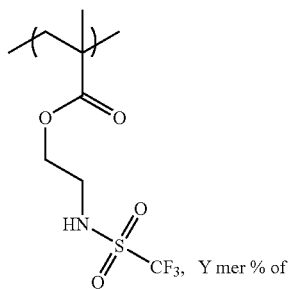 Y mer % of

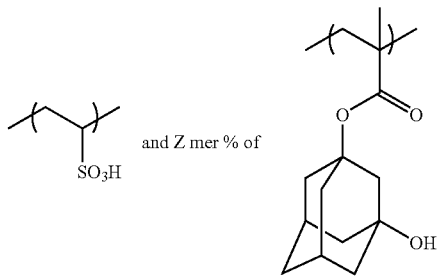 and Z mer % of wherein W=any number from 0 to 99.9, Y=any number from 0.1 to 99.9, Z=any number from 0 to 99.9, such that W+Y+Z is greater than or equal to 50 and less than or equal to 100, (i) a polymer comprising W mer % of

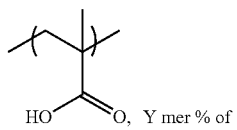 Y mer % of

-continued

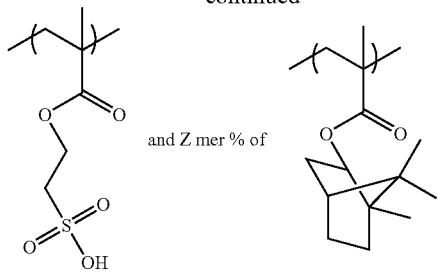 and Z mer % of 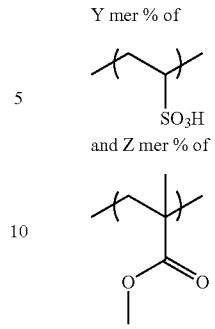

wherein W=any number from 0 to 99.9, Y=any number from 0.1 to 99.9, Z=any number from 0 to 99.9, such that W+Y+Z is greater than or equal to 50 and less than or equal to 100, (j) a polymer comprising W mer % of

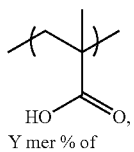

Y mer % of

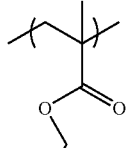

and Z mer % of

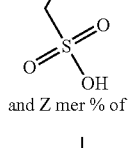

wherein W=any number from 0 to 99.9, Y=any number from 0.1 to 99.9, Z=any number from 0 to 99.9, such that W+Y+Z is greater than or equal to 50 and less than or equal to 100, and (k) a polymer comprising W mer % of

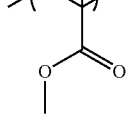

Y mer % of

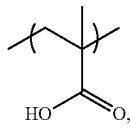

and Z mer % of wherein W=any number from 0 to 99.9, Y=any number from 0.1 to 99.9, Z=any number from 0 to 99.9, such that W+Y+Z is greater than or equal to 50 and less than or equal to 100.

14. The method of claim 1, wherein a first measurement of receding water contact angle of a mixture of said first and second polymers on a surface of a photoresist layer is greater than a weighted average of a second measurement of receding water contact angle of said first polymer on said surface of said photoresist layer and a third measurement of a receding water contact angle of said second polymer on said surface of said photoresist layer, said weighted average weighted by relative weights of said first and second polymers in said mixture.

15. The method of claim 1, wherein a first measurement of a receding water contact angle of said first polymer on a surface of a photoresist layer is greater than a second measurement of a receding water contact angle of said second polymer on said surface of said photoresist layer.

16. The method of claim 1, wherein a first dose of radiation required to form a developable image in said photoresist layer is equal to a second dose of radiation required to form a developable image in said photoresist layer if said photoresist layer were covered by a layer consisting only of said second polymer.

17. The method of claim 1, further including, between steps (c) and (d), heating said photoresist layer to a temperature above room temperature.

18. The method of claim 1, further including:
(f) heating remaining regions of said photoresist layer to a temperature above room temperature.

19. The method of claim 1, wherein a weight percentage of fluorine in said first polymer is greater than a weight percentage of fluorine in said second polymer.

* * * * *